US012382640B2

(12) United States Patent
Lee et al.

(10) Patent No.: US 12,382,640 B2
(45) Date of Patent: Aug. 5, 2025

(54) MEMORY DEVICE AND METHOD FOR FABRICATING THE SAME

(71) Applicant: Taiwan Semiconductor Manufacturing Company, Ltd., Hsinchu (TW)

(72) Inventors: Ya-Ling Lee, Hsinchu (TW); Wei-Gang Chiu, New Taipei (TW); Yen-Chieh Huang, Changhua County (TW); Han-Ting Tsai, Kaoshiung (TW); Tsann Lin, Taipei (TW); Yu-Ming Lin, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 707 days.

(21) Appl. No.: 17/716,330

(22) Filed: Apr. 8, 2022

(65) Prior Publication Data
US 2022/0231036 A1    Jul. 21, 2022

Related U.S. Application Data

(63) Continuation-in-part of application No. 17/166,078, filed on Feb. 3, 2021, now Pat. No. 11,706,928.
(Continued)

(51) Int. Cl.
*H01L 51/30*      (2006.01)
*H10B 53/30*      (2023.01)
(Continued)

(52) U.S. Cl.
CPC ......... *H10B 53/30* (2023.02); *H10D 30/0415* (2025.01); *H10D 30/701* (2025.01)

(58) Field of Classification Search
CPC ... H10B 53/30; H10D 30/0415; H10D 30/701
(Continued)

(56) References Cited

U.S. PATENT DOCUMENTS 6,921,702 B2    7/2005    Ahn et al.
7,217,643 B2    5/2007    Liang et al.
(Continued)

FOREIGN PATENT DOCUMENTS

CN      110165053 A    8/2019
KR      20080062743 A    7/2008
KR      20200026668 A    3/2020

OTHER PUBLICATIONS

Yoon et al. "Influence of Applied Current Density on Properties of Cu thin layer Electrodeposited from Copper Pyrophosphate Bath" J. Korean Inst. Surf. Eng., vol. 53, No. 4, 2020, published on Aug. 30, 2020.
(Continued)

*Primary Examiner* — Sheikh Maruf
(74) *Attorney, Agent, or Firm* — Eschweiler & Potashnik, LLC

(57) ABSTRACT

An integrated circuit device includes a ferroelectric layer that is formed with chlorine-free precursors. A ferroelectric layer formed according to the present teaching may be chlorine-free. Structures adjacent the ferroelectric layer are also formed with chlorine-free precursors. The absence of chlorine in the adjacent structures prevents diffusion of chlorine into the ferroelectric layer and prevents the formation of chlorine complexes at interfaces with the ferroelectric layer. The ferroelectric layer may be used in a memory device such as a ferroelectric field effect transistor (FeFET). The absence of chlorine ameliorates time-dependent dielectric breakdown (TDDB) and Bias Temperature Instability (BTI).

20 Claims, 10 Drawing Sheets

Related U.S. Application Data

(60) Provisional application No. 63/107,579, filed on Oct. 30, 2020.

(51) Int. Cl.
*H10D 30/01* (2025.01)
*H10D 30/69* (2025.01)

(58) Field of Classification Search
USPC .......................................................... 257/295
See application file for complete search history.

(56) References Cited

U.S. PATENT DOCUMENTS

| | | | |
|---|---|---|---|
| 7,833,913 B2 | 11/2010 | Clark | |
| 8,568,530 B2 | 10/2013 | Heys et al. | |
| 2002/0177244 A1 | 11/2002 | Hsu et al. | |
| 2003/0027360 A1 | 2/2003 | Hsu et al. | |
| 2004/0182315 A1 | 9/2004 | Laflamme, Jr. et al. | |
| 2005/0260347 A1* | 11/2005 | Narwankar | H01L 21/3141 |
| | | | 257/E21.267 |
| 2005/0269613 A1* | 12/2005 | Li | H10D 64/033 |
| | | | 257/295 |
| 2008/0023746 A1 | 1/2008 | Choi et al. | |
| 2009/0020797 A1 | 1/2009 | Wang | |
| 2009/0057737 A1 | 3/2009 | Boescke | |
| 2009/0261395 A1* | 10/2009 | Boescke | H10D 64/689 |
| | | | 257/295 |
| 2010/0243994 A1 | 9/2010 | Yoon et al. | |
| 2010/0261342 A1 | 10/2010 | Clark et al. | |
| 2010/0270626 A1 | 10/2010 | Raisanen | |
| 2012/0007158 A1 | 1/2012 | Yoon et al. | |
| 2014/0355328 A1 | 12/2014 | Mueller et al. | |
| 2015/0017813 A1 | 1/2015 | Akiyama et al. | |
| 2015/0340372 A1 | 11/2015 | Pandey et al. | |
| 2016/0118280 A1* | 4/2016 | Wood | H01L 21/6719 |
| | | | 414/804 |
| 2017/0345831 A1* | 11/2017 | Chavan | H10B 53/30 |
| 2017/0358684 A1 | 12/2017 | Chen et al. | |
| 2017/0365719 A1 | 12/2017 | Chen et al. | |
| 2018/0076334 A1* | 3/2018 | Ando | H10D 30/0415 |
| 2018/0083141 A1 | 3/2018 | Chen et al. | |
| 2018/0151577 A1* | 5/2018 | Mueller | H10D 64/017 |
| 2018/0166453 A1 | 6/2018 | Mueller | |
| 2018/0174826 A1 | 6/2018 | Raaijmakers et al. | |
| 2018/0269057 A1 | 9/2018 | Lei et al. | |
| 2018/0331113 A1 | 11/2018 | Liao et al. | |
| 2018/0337053 A1 | 11/2018 | Huang et al. | |
| 2018/0337055 A1* | 11/2018 | Yamaguchi | H10D 64/033 |
| 2019/0019875 A1 | 1/2019 | Tsai et al. | |
| 2019/0057860 A1* | 2/2019 | Yoon | H01L 21/022 |
| 2019/0067488 A1 | 2/2019 | Tsai et al. | |
| 2019/0130956 A1 | 5/2019 | Mueller et al. | |
| 2019/0189627 A1 | 6/2019 | Pandey et al. | |
| 2019/0244973 A1 | 8/2019 | Yoo | |
| 2020/0020762 A1 | 1/2020 | Frank et al. | |
| 2020/0035493 A1 | 1/2020 | Clark et al. | |
| 2020/0075075 A1 | 3/2020 | Chen et al. | |
| 2020/0105897 A1 | 4/2020 | Hsu et al. | |
| 2020/0227515 A1* | 7/2020 | Shifren | H10D 1/68 |
| 2020/0303558 A1 | 9/2020 | Fujii | |
| 2021/0013219 A1 | 1/2021 | Okuno et al. | |
| 2021/0359101 A1* | 11/2021 | Heo | H10D 30/6735 |
| 2021/0375890 A1* | 12/2021 | Chia | H10B 51/30 |
| 2021/0391470 A1* | 12/2021 | Manfrini | H10D 64/017 |
| 2022/0282367 A1 | 9/2022 | Macdonald et al. | |
| 2022/0351769 A1 | 11/2022 | Chen et al. | |
| 2023/0336006 A1 | 10/2023 | Kobayashi et al. | |

OTHER PUBLICATIONS

Non-Final Office Action dated Jun. 9, 2022 for U.S. Appl. No. 17/166,078.
Final Office Action dated Dec. 8, 2022 for U.S. Appl. No. 17/166,078.
Notice of Allowance dated Mar. 7, 2023 for U.S. Appl. No. 17/166,078.
Ribes et al. "Review on High-k Dielectrics Reliability Issues" IEEE Transactions on Device and Materials Reliability, vol. 5, No. 1, Mar. 2005. Published Mar. 2005.
Gall et al. "Advanced concepts for TDDB reliability in conjunction with 3D stress" AIP Conference Proceedings 1601, 79 (2014), published on Feb. 17, 2015.
Wikipedia.org "Time-dependent gate oxide breakdown" Published on Jun. 21, 2020.
Lee et al. "A Brief Review on the Effect of Impurities on the Atomic Layer Deposited Fluorite-Structure Ferroelectrics" Journal of the Korean institute of surface engineering, vol. 53 Issue 4, published on Aug. 24, 2020.

* cited by examiner

MEMORY DEVICE AND METHOD FOR FABRICATING THE SAME

REFERENCE TO RELATED APPLICATION

This application claims the benefit of U.S. Provisional Application No. 63/107,579, filed on Oct. 30, 2020, and U.S. patent application Ser. No. 17/166,078, filed Feb. 3, 2021, the contents of which are incorporated herein by reference in their entirety.

BACKGROUND

Many modern-day electronic devices contain electronic memory. Electronic memory may be volatile or non-volatile. Non-volatile memory is able to retain data in the absence of power, whereas volatile memory loses data when power is lost. Dynamic random-access memory (DRAM) is volatile and requires frequent refresh. Examples of non-volatile memory includes resistive random-access memory (RRAM), magnetoresistive random-access memory (MRAM), ferroelectric random-access memory (FeRAM), phase-change memory (PCM), and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
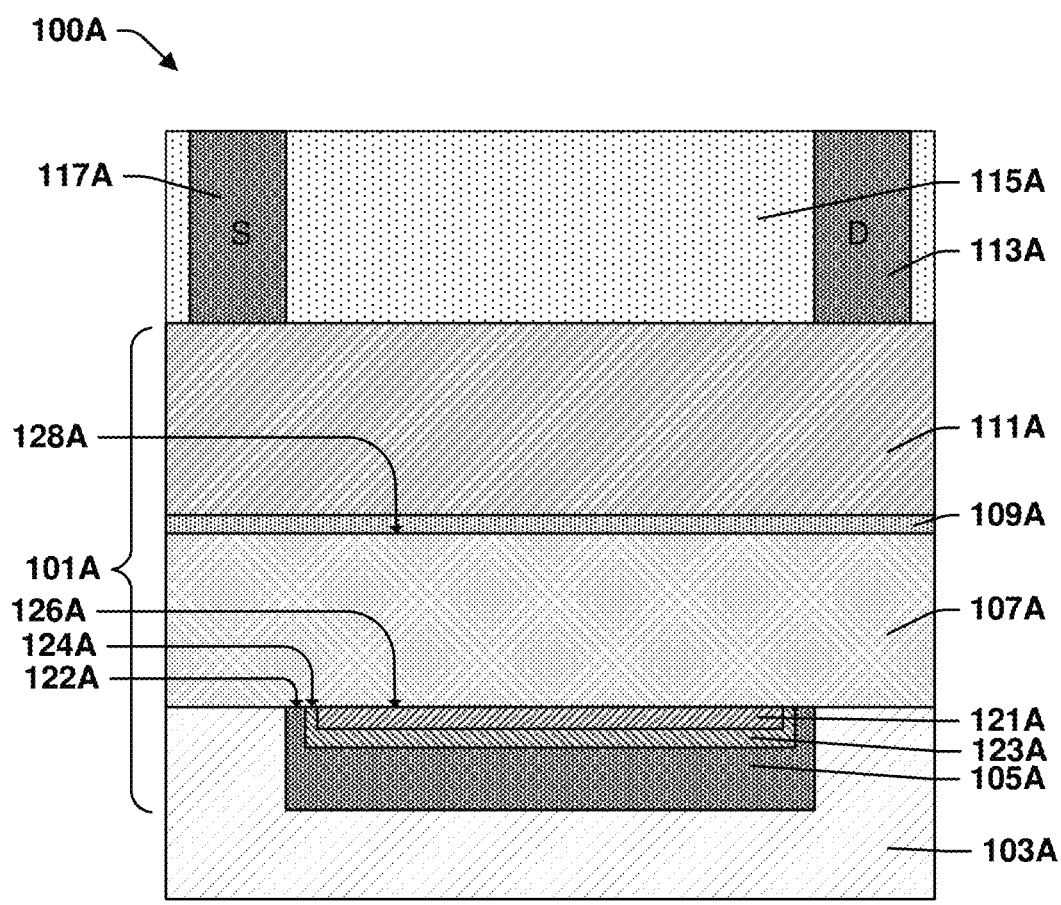
FIG. 1A illustrates a cross-sectional side view of an integrated circuit device according to some aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A variety of integrated circuit (IC) devices include layers of ferroelectric material. For example, ferroelectric memory uses a ferroelectric layer for data storage. The data may be stored by retaining a polarization of electric dipoles in the ferroelectric layer. A first orientation of those dipoles may represent a logical "1" and a second orientation may represent a logical "0". There are a variety of ferroelectric memory structures. In some embodiments, a ferroelectric memory includes a ferroelectric layer disposed between two plates in a capacitor that stores data. A 1T-1C memory architecture, for example, may use ferroelectric capacitors. In some embodiments, a ferroelectric memory has the structure of a metal-ferroelectric-metal-insulator-semiconductor field-effect transistor (MFMIS-FET) in which the bottom electrode of a ferroelectric capacitor is coupled to the gate electrode of a field-effect transistor (FET). The gate electrode and the bottom electrode of the ferroelectric capacitor function as a single floating gate. In some embodiments, a ferroelectric memory has a ferroelectric layer disposed between a gate electrode and a channel in a transistor structure. A ferroelectric field effect transistor (FeFET) is an example.

It is desirable for ferroelectric memory to have long lifetime and high reliability. Lifetime is limited by time-dependent dielectric breakdown (TDDB) and bias temperature instability (BTI). TDDB manifests as a leakage current that increases over extended periods of operation. BTI seems related to charge trapping and manifests as a variation in a threshold voltage over periods of continuous operation. BTI includes positive bias temperature instability (PBTI) and negative bias temperature instability (NBTI). The causes and mechanisms of TDDB and BTI are not well understood making them difficult to manage.

The inventors of the present disclosure have determined that TDDB and BTI can be ameliorated by eliminating chlorine residues from ferroelectric layers and nearby structures, especially structures that border the ferroelectric layers. They have determined that as little as 1 ppm chlorine in the ferroelectric layer or one of the surrounding structures can result in TDDB/BTI and that TDDB/BTI can be substantially mitigated by producing and maintaining the ferroelectric layer and surrounding structures with less than 1 ppm chlorine. TDDB/BTI due to 1 ppm chlorine has been observed with ferroelectric materials of the composition $Hf_xZr_{1-x}O_2$ as a specific example. In the formula, x has a range from 0 to 1. The formula includes $HfO_2$, $HfZrO_2$, and $ZrO_2$.

Ferroelectric layers are generally produced by atomic layer deposition (ALD) using metal chloride precursors. The performance of a ferroelectric layer is strongly influenced by layer thickness. ALD allows precise control of layer thicknesses. Metal chloride precursors have volatilities and reaction rates well suited to the ALD process. Ferroelectric memory may include other layers that comprise metals and are ordinarily produced by ALD using metal chloride precursors. These other layers include work function metal layers, electrodes, and insulating layers. While not wishing to be bound by theory, it has been observed that as little as 1 ppm of chlorine in any of these layers or in the metal electrodes of a ferroelectric memory device can result in the development of fixed charge clusters, particularly at interfaces, and that these fixed charge clusters can result in TDDB or BTI.

In accordance with the present disclosure, the ferroelectric layer of a ferroelectric memory cell has less than 1 ppm chlorine. In some embodiments, the ferroelectric memory cell comprises other layers that include metal compounds but have less than 1 ppm chlorine. In some embodiments, these other layers include a work function metal layer. In some embodiments, the work function metal layer comprises an alloy of two metals. In some embodiments, these other layers include a two work function metal layers. In some embodiments, the two work function metal layers are between the ferroelectric layer and an electrode. In some embodiments, the two work function metal layers are on opposite sides of the ferroelectric layer. In some embodiments, the other layers include an insulating layer. In some embodiments, the electrodes of the ferroelectric memory cell have less than 1 ppm chlorine. In some embodiments, all the structures of the ferroelectric memory cell have less than 1 ppm chlorine.

In some embodiments, the ferroelectric layer is produced from gaseous precursors that include chlorine-free metal compounds. In some embodiments, a work function metal layer is produced from gaseous precursors that include chlorine-free metal compounds. In some embodiments, the work function metal layer is produced from gaseous precursors that include a chlorine-free precursor of a first metal and a chlorine free precursor of a second metal. In some embodiments, an insulating layer is produced from gaseous precursors that include chlorine-free metal compounds. Using precursors that are chlorine-free eliminates chlorine residues.

In some embodiments, the chlorine-free precursors include metal compounds in which the metal is directly bonded to oxygen, nitrogen, carbon, or a combination thereof. In some embodiments, the chlorine-free precursors include a metal compound in which the metal is directly bonded to carbon. In some embodiments, the chlorine-free precursors include a metal compound in which the metal is directly bonded to oxygen. In some embodiments, the chlorine-free precursors include a metal compound in which the metal is directly bonded exclusively to oxygen and/or carbon. In some embodiments, the chlorine-free precursors include a metal compound with a hydrocarbon functional group. In some embodiments, the chlorine-free precursors include a metal compound with a carbonyl functional group. In some embodiments, the chlorine-free precursors include a metal in a cyclopentadienyl complex. In some embodiments, the chlorine-free metal precursors include a metal compound with a nitrogen functional group. In some embodiments, the chlorine-free metal precursors include a metal compound with hydrofluorocarbon functional group.

In some embodiments, the chlorine-free precursors include a metal compound in which the metal is directly bonded to nitrogen. In some embodiments, the chlorine-free precursors include a metal compound in which the metal is bonded exclusively to nitrogen. Excellent results have been obtained with precursors of the form $M(NR^1R^2)_4$, where M is zirconium (Zr), halfnium (Hf), or the like and $R^1$ and $R^2$ are organic functional groups.

In some embodiments, the organic functional groups are alkanes, alkenes, alkynes, alcohols, amines, ethers, aldehydes, ketones, carboxylic acids, esters, amides, or the like. In some embodiments, the precursors include one or more of:

zirconium(IV) tert-butoxide ($Zr[OC(CH_3)_3]_4$ or ZTB);
bis(methyl-η5-clyclopentadienyl)methoxymethylzirconium ($Zr[CH_3C_5H_4]_2CH_3OCH_3$, ZRCMMM, or ZrD-CO4);
tetrakis(dimethylamino)zirconium(IV) ($Zr[N(CH_3)_2]_4$ or TDMAZ);
tetrakis(ethylmethylamido)zirconium(IV) ($Zr[N(CH_3)(C_2H_5)]_4$ or TEMAZ);
bis(methyl-η5-clyclopentadienyl)dimethylhafnium (Hf$[CH_3C_5H_4]_2CH_3OCH_3$, HFCMME, or HfD-CO$_2$);
bis(methyl-η5-clyclopentadienyl)methoxymethylhafnium (HfCH$_3$OCH$_3[C_5H_4]_2$ or HfD-CO4);
tetrakis(dimethylamino)hafnium(IV) (Hf$[N(CH_3)_2]_4$ or TDMAH);
tetrakis(ethylmethylamido)hafnium(IV) (Hf$[N(CH_3)(C_2H_5)]_4$ or TEMAH);
or the like.

The ferroelectric layer may be incorporated into any type of integrated circuit device. In some embodiments, the ferroelectric layer is included in a memory cell of a memory device. The memory can be of any type. In some embodiments the ferroelectric memory includes the ferroelectric layer in a transistor structure. In some embodiments, the transistor has a bottom gate. In some embodiments, the transistor has a top gate. In some embodiments, the transistor is in a three-dimensional (3D) memory array. In some embodiments, the transistor has a metal-ferroelectric-semiconductor (MFS) structure. In some embodiments, the transistor has a metal-ferroelectric-insulator-semiconductor (MFIS) structure. In some embodiments the ferroelectric memory includes the ferroelectric layer in a capacitor structure. In some embodiments, the memory is ferroelectric random access memory (FeRAM) in which the ferroelectric capacitor is coupled to a drain region of a field effect transistor (FET). In some embodiments, the memory has a metal-ferroelectric-metal-insulator-semiconductor (MFMIS) structure in which the ferroelectric capacitor is coupled to the gate of an FET.

A ferroelectric memory cell according to the present disclosure has a lower time-dependent dielectric breakdown rate (TDDB rate) and a lower BTI rate in comparison to an equivalent ferroelectric memory cell with just 1 ppm more of chlorine in the ferroelectric layer. TDDB rates may not be well characterized over short periods of operation but may be consistently determined when consider over a longer period of operation such as a period over which the leakage current doubles or a period over which the Weibull slope is decreasing. Accordingly, for use in comparisons, the TDDB rate may be defined as the initial leakage current divided by a time of operation over which the initial leakage current doubles. Alternatively, the TDDB rate may be determined over a period in which the Weibull slope is decreasing.

The ferroelectric layer of a ferroelectric memory cell according to the present disclosure may be formed with chlorine-free precursors. The ferroelectric layer of a comparison ferroelectric memory cell may be formed by adding some chloride precursors to the process gas mix. The comparison ferroelectric memory cell will have a larger TDDB rate than that of the ferroelectric memory cell according to the present disclosure. In some embodiments, the comparison memory cell that has 1 ppm more of chlorine in the ferroelectric layer has a TDDB more than twice that of a memory cell according to the present disclosure. In some embodiments, BTI rate, defined as the rate at which the threshold voltage changes during continuous operation, is half or less that of the comparison memory cell.

FIG. 1A illustrates an integrated circuit device 100A having a memory cell 101A according to some aspects of the present disclosure. The memory cell 101A includes a ferroelectric layer 107A in a transistor structure. The transistor structure includes a gate electrode 105A, an alloy work function metal layer 121A, a second work function metal layer 123A, the ferroelectric layer 107A, an insulating layer 109A, a channel layer 111A, a source coupling 117A, and a drain coupling 113A. The ferroelectric layer 107A is between the channel layer 111A and the gate electrode 105A. The insulating layer 109A is an optional layer between the ferroelectric layer 107A and the channel layer 111A. The insulating layer 109A makes direct contact with the ferroelectric layer 107A at an interface 128A.

The gate electrode 105A, the alloy work function metal layer 121A, and the second work function metal layer 123A may be within a substrate 103A underneath the ferroelectric layer 107A. In this configuration, the gate electrode 105A is a bottom gate. The source coupling 117A and the drain coupling 113A may be vias in an interlevel dielectric 115A. Each of these structures has less than 1 ppm chlorine.

The alloy work function metal layer 121A is between the second work function metal layer 123A and the ferroelectric layer 107A. The second work function metal layer 123A is between the gate electrode 105A and the alloy work function metal layer 121A. The alloy work function metal layer 121A makes direct contact with the ferroelectric layer 107A at an interface 126A. The second work function metal layer 123A makes direct contact with the ferroelectric layer 107A at an interface 124A. The gate electrode 105A makes direct contact with the ferroelectric layer 107A at an interface 122A.

In some embodiments, the ferroelectric layer 107A is an HfZrO layer. In some embodiments, the ferroelectric layer 107A is of the formula $HF_xZr_{1-x}O_2$ where x in the range from 0 to 1. In some embodiments, the ferroelectric layer is $HF_xZr_{1-x}O_2$ where x in the range from 0.1 to 0.9. In some embodiments, the ferroelectric layer is $HF_{0.5}Zr_{0.5}O_2$. In some embodiments, the ferroelectric layer has HFZrO in more than 50% combined t-phase (tetragonal), o-phase (orthorhombic), and c-phase (cubic) and less than 50% m-phase (monoclinic). In some embodiments, the HFZrO is doped with smaller radius ions that increase 2Pr. Smaller radius ions include ions of aluminum (Al), silicon (Si), and the like. In some embodiments, the HFZrO is doped with larger radius ions that increase 2Pr. Larger radius ions include ions of lanthanum (La), scandium (Sc), calcium (Ca), barium (Ba), gadolinium (Gd), yttrium (Y), and the like. 2Pr is a measure of the switching polarization of a ferroelectric material. In some embodiments, the ferroelectric layer has oxygen vacancies.

In some embodiments, the ferroelectric layer 107A is aluminum nitride (AlN) doped with scandium (Sc) or the like. The ferroelectric layer 107A may alternatively be another ferroelectric material. Examples of other ferroelectric materials that may be used include, without limitation, hafnium aluminum oxide (HfAlO), hafnium lanthanum oxide (HfLaO), hafnium zirconium oxide (HfZrO), hafnium cerium oxide (HfCeO), hafnium oxide (HfO), hafnium silicon oxide (HfSiO), hafnium gadolinium oxide (HFGdO), and the like.

The ferroelectric layer 107A may be from 0.1 nm to 100 nm thick. In some embodiments, the ferroelectric layer 107A is from 1 nm to 30 nm thick. If the ferroelectric layer 107A is too thin, it may not provide adequate threshold voltage switching in the memory cell 101A. If the ferroelectric layer 107A is too thick, it may not have a desired concentration of oxygen vacancies. The ferroelectric layer 107A has a uniformity of thickness that is characteristic of formation by an atomic layer deposition process (ALD) and comprises less than 1 ppm chlorine. In some embodiments the ferroelectric layer 107A is chlorine-free.

The insulating layer 109A is a dielectric. In some embodiments, the insulating layer 109A has a thickness in the range from 0.1 nm to 10 nm. In some embodiments, the insulating layer 109A has a thickness in the range from 0.3 nm to 3 nm. If the insulating layer 109A is too thin, it may not be functional. If the insulating layer 109A is too thick, it may interfere with operation of the memory cell 101A. The insulating layer 109A has a uniformity of thickness that is characteristic of formation by an atomic layer deposition process (ALD) and comprises less than 1 ppm chlorine.

The insulating layer 109A may comprise silicon (Si), magnesium (Mg), aluminum (Al), yttrium (Y), lanthanum (La), strontium (Sr), gadolinium (Gd), scandium (Sc), calcium (Ca), a compound thereof, a combination thereof, or the like. In some of these embodiments the insulating layer 109A comprises a compound of two or more metals. In some embodiments, the insulating layer 109A includes hafnium oxide ($HfO_2$). In some embodiments, the insulating layer 109A comprises a compound that include silicon and a metal. In some embodiments, the insulating layer 109A includes hafnium oxide ($HfO_2$) and silicon (Si). The atomic ratio of silicon to hafnium may be 10% or more. In any of these embodiments the insulating layer 109A may be chlorine-free.

The channel layer 111A is a semiconductor. In some embodiments, the channel layer 111A is or includes an oxide semiconductor. Oxide semiconductors that may be suitable for the channel layer 111A include, without limitation, zinc oxide (ZnO), magnesium oxide (MgO), gadolinium oxide (GdO), indium tungsten oxide (InWO), indium gallium zinc oxide (InGaZnO), indium zinc oxide (InZnO), indium gallium zinc tin oxide (InGaZnSnO or IGZTO), indium tin oxide (InSnO or ITO), combinations thereof, or the like. In some embodiments, the channel layer 111A is or includes polysilicon, amorphous silicon, silicon geranium (SiGe), or the like. In some embodiments, the channel layer 111A has a thickness in the range from 0.1 nm to 100 nm. In some embodiments, the channel layer 111A has a thickness in the range from 2 nm to 30 nm. In some embodiments, the channel layer 111A has a thickness in the range from 5 nm to 20 nm. In some of these embodiments the channel layer 111A includes a metal compound and comprises less than 1 ppm chlorine. In some of these embodiments the channel layer 111A is a compound that includes two distinct metals and is chlorine-free.

The source coupling 117A, the drain coupling 113A, and the gate electrode 105A, may be formed of any suitable conductive materials. Suitable conductive materials may include doped polysilicon, graphene, metals, and the like. In some embodiments, the source coupling 117A, the drain coupling 113A, and the gate electrode 105A are formed with metals. Some examples of metals that may be used are tungsten (W), copper (Cu), ruthenium (Ru), molybdenum (Mo), cobalt (Co), aluminum (Al), nickel (Ni), silver (Ag), gold (Au), titanium (Ti), tellurium (Te), platinum (Pt), tantalum (Ta), a combination thereof, an alloy thereof, or the like.

The source coupling 117A and the drain coupling 113A may comprise less than 1 ppm chlorine. In some embodiments the source coupling 117A and the drain coupling 113A are an alloy of two or more metals. In some of these embodiments each the source coupling 117A and the drain coupling 113A are chlorine-free. The gate electrode 105A comprises less than 1 ppm chlorine. In some embodiments the gate electrode 105A is an alloy of two or more metals. In some of these embodiments the gate electrode 105A is chlorine-free.

The second work function metal layer 123A may be a metal compound. Some examples of materials that may be used for the second work function metal layer 123A are titanium nitride (TiN), tantalum nitride (TaN), molybdenum nitride (MoN), tungsten nitride (WN), tungsten carbonitride (WCN), zirconium nitride (ZrN), hafnium nitride (HfN), ruthenium oxide (RuOx), and the like. The second work function metal layer 123A comprises less than 1 ppm chlorine. In some embodiments the second work function metal layer 123A comprises an alloy of two or more metals. In some of these embodiments the second work function metal layer 123A is chlorine-free.

The alloy work function metal layer 121A comprises an alloy of two or more metals. In some embodiments, the alloy work function metal layer 121A comprises an alloy of three or more metals. In some embodiments, the alloy work function metal layer 121A comprises an alloy of four or more metals. The alloy work function metal layer 121A comprises less than 1 ppm chlorine. In some embodiments the alloy work function metal layer 121A is chlorine-free. The metals may be from the group that includes titanium (Ti), tantalum (Ta), molybdenum (Mo), tungsten (W), tungsten (W), zirconium (Zr), hafnium (Hf), ruthenium (Ru), nickel (Ni), manganese (Mn), palladium (Pd), iron (Fe), cobalt (Co), beryllium (Be), copper (Cu), barium (Ba), thorium (Th), calcium (Ca), strontium (Sr), silver (Ag), yttrium (Y), cerium (Ce), lanthanum (La), lithium (Li), cesium (Cs), and the like. The metals may be compounded with nitrogen, carbon, oxygen, or the like. Specific examples include zirconium-cerium (Zr—Ce), tungsten-beryllium (W—Be), copper-barium (Cu—Ba), tungsten-lanthanum (W—La), tungsten-yttrium (W—Y), tungsten-zirconium (W—Zr), tungsten-calcium (W—Ca), tungsten-strontium (W—St), tungsten-lithium (W—Li), nickel-barium (Ni—Ba), nickel-cesium (Ni—Cs), molybdenum-thorium (Mo—Th), molybdenum-cesium (Mo—Cs), tantalum-cesium (Ta—Cs), tantalum-thorium (Ta—Th), titanium-cesium (Ti—Cs), silver-barium (Ag—Ba), combinations of other work function metals, and the like.

The interlevel dielectric 115A may be undoped silicate glass (USG) or the like. In some embodiments, the interlevel dielectric 115A is a low-κ dielectric. In some embodiments, the interlevel dielectric 115A is an extremely low-κ dielectric. A low-κ dielectric is a material having a dielectric constant lower than that of silicon dioxide. Examples of low-κ dielectrics include organosilicate glasses (OSG) such as carbon-doped silicon dioxide, fluorine-doped silicon dioxide (otherwise referred to as fluorinated silica glass or FSG), and organic polymer low-k dielectrics. Examples of organic polymer low-k dielectrics include polyarylene ether, polyimide (PI), benzocyclobutene, and amorphous polytetrafluoroethylene (PTFE). An extremely low-κ dielectric is a material having a dielectric constant of about 2.1 or less. An extremely low-κ dielectric can be formed by deposition of a low-κ dielectric in such a manner that it has porosity or air-gaps, whereby the effective dielectric constant of the composite including pores and air gaps is 2.1 or less. The interlevel dielectric 115A has less than 1 ppm chlorine. In some embodiments the interlevel dielectric 115A is chlorine-free.

The substrate 103A may be a die cut from a wafer, such as a silicon wafer or the like. The substrate 103A may be a semiconductor substrate, such as a bulk semiconductor, a semiconductor-on-insulator (SOI) substrate, or the like. Other substrates, such as a multilayered or gradient substrate may also be used. In some embodiments, the semiconductor material of the substrate 103A is or includes silicon, germanium, silicon carbide, gallium arsenide, gallium phosphide, indium phosphide, indium arsenide, and/or indium antimonide, silicon germanium, gallium arsenide phosphide, aluminum indium arsenide, aluminum gallium arsenide, gallium indium arsenide, gallium indium phosphide, gallium indium arsenide phosphide, combinations thereof, or the like. The substrate 103A may be or include a dielectric material. For example, the substrate 103A may be a dielectric substrate or may include a dielectric layer on a semiconductor substrate. The dielectric material may be an oxide such as silicon oxide, a nitride such as silicon nitride, a carbide such as silicon carbide, combinations thereof such as silicon oxynitride, silicon oxycarbide, silicon carbonitride, the like, or any other suitable dielectric.

In the memory cell 101A, there is threshold voltage on the gate electrode 105A at which the channel layer 111A begins to conduct between the source coupling 117A and the drain coupling 113A. That threshold voltage may be varied through write and erase operations that alter a polarization of electrical dipoles within the ferroelectric layer 107A. A first orientation of those electrical dipoles provides a first threshold voltage that may represent a logical "1" and a second orientation of those electrical dipoles provides a second threshold voltage that may represent a logical "0".

A write operation for the memory cell 101A may include setting the gate electrode 105A to a programming voltage $V_{th}$ while grounding the source coupling 117A and the drain coupling 113A. $V_{th}$ may be the highest possible threshold voltage for the memory cell 101A. For an erase operation, the gate electrode 105A may be set to $-V_{th}$ while grounding the source coupling 117A and the drain coupling 113A. A read operation may include setting the gate electrode 105A to a voltage intermediate between the first threshold voltage and the second threshold voltage, for example ½ $V_{th}$, setting the source coupling 117A to $V_{dd}$, setting the drain coupling 113A to ground, and determining whether a resulting current is above or below a threshold. Operation of the memory cell 101A includes a combination of the read, write, and erase operations. A specific operating protocol may be set for determining the TDDB rate or the BTI rate. In some embodiments, the operating protocol includes applying constant voltage stress (CVS). To determine the BTI rate small gate voltage pulses may be applied to measure $V_{th}$ while voltage stress is continuously maintained.

Figure 1B:
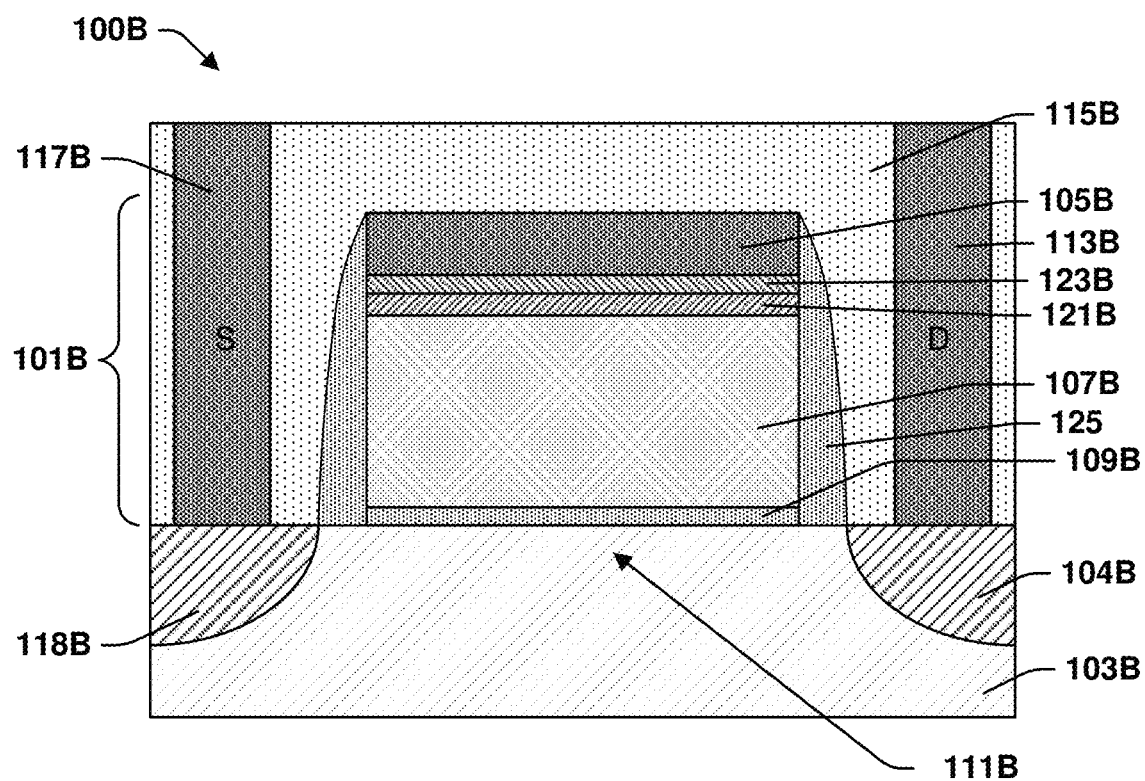
FIG. 1B illustrates a cross-sectional side view of an integrated circuit device according to some other aspects of the present disclosure.

FIG. 1B illustrates an integrated circuit device 100B having a memory cell 101B according to some other aspects of the present disclosure. The memory cell 101B has a transistor structure including a source region 118B, a drain region 104B, a channel 111B, a ferroelectric layer 107B, an insulating layer 109B, an alloy work function metal layer 121B, a second work function metal layer 123B, and a gate electrode 105B. The source region 118B, the drain region 104B, and the channel 111B are provided by semiconductor portions of a substrate 103B. The source region 118B and the drain region 104B have one doping type and the channel 111B has an opposite doping type. A source coupling 117B connects with the source region 118B. A drain coupling 113B connects with the drain region 104B. The source coupling 117B and the drain coupling 113B are vias in an interlevel dielectric 115B and may connect with a metal interconnect disposed over the substrate 103B. The gate electrode 105B is above the ferroelectric layer 107B and the channel 111B. In this configuration, the gate electrode 105B is a top gate.

The description of the gate electrode 105A applies to the gate electrode 105B. The description of the alloy work function metal layer 121A applies to the alloy work function metal layer 121B. The description of the second work function metal layer 123A applies to the second work function metal layer 123B. The description of the ferroelectric layer 107A applies to the ferroelectric layer 107B. The description of the insulating layer 109A applies to the insulating layer 109B. The description of the substrate 103A applies to the substrate 103B with the proviso that the channel 111B is a semiconductor. The description of the source coupling 117A applies to the source coupling 117B. The description of the drain coupling 113A applies to the drain coupling 113B.

While the memory cell 101B has been presented as a memory cell, the same arrangement of materials may be used in a related field effect transistor with metal oxide semiconductor structure (MOSFET). The ferroelectric layer 107B with the same composition may be used as a high-κ dielectric layer, although a different thickness may be more suitable for that application. As in the memory cell application, a low chlorine content facilitates achieving low TDDB.

Figure 2:
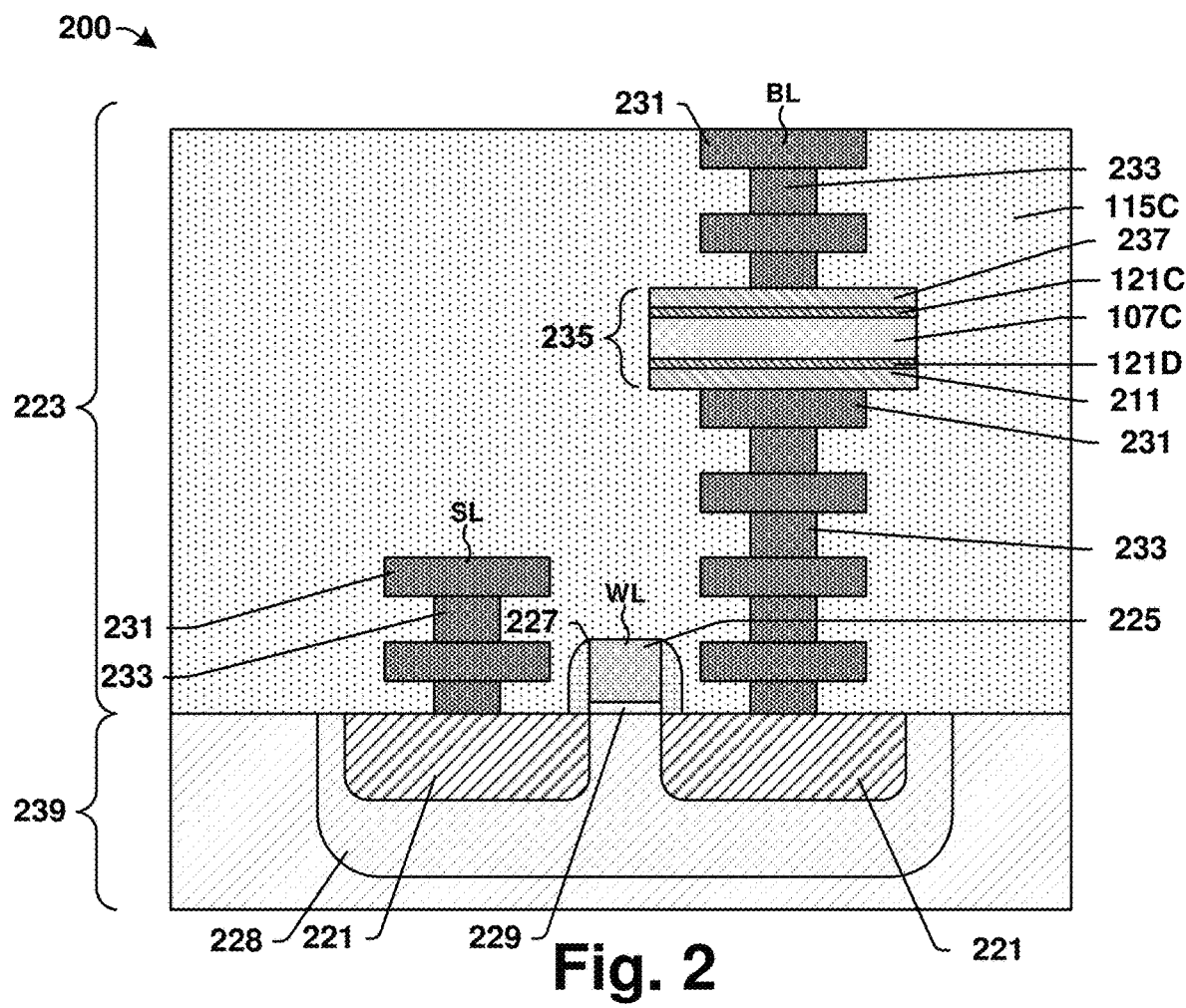
FIG. 2 illustrates a cross-sectional side view of an integrated circuit device according to some other aspects of the present disclosure.

FIG. 2 illustrates an integrated circuit device 200 having a 1T1C memory device that includes a transistor 227 and a ferroelectric capacitor 235 according to some aspects of the present disclosure. The ferroelectric capacitor 235 includes a ferroelectric layer 107C between a top electrode 237 and a bottom electrode 211. A first alloy work function metal layer 121C is between the top electrode 237 and the ferroelectric layer 107C and is in direct contact with the ferroelectric layer 107C. A second alloy work function metal layer 121D is between the bottom electrode 211 and the ferroelectric layer 107C and is also in direct contact with the ferroelectric layer 107C.

The ferroelectric capacitor 235 is disposed in a metal interconnect 223 that is over a semiconductor substrate 239. The metal interconnect 223 includes wires 231 and vias 233, which may be surrounded by an interlevel dielectric 115C. The ferroelectric capacitor 235 may be disposed between the $3^{rd}$ and $4^{th}$ metallization layers, the $4^{th}$ and $5^{th}$ metallization layers, or any other adjacent pair of metallization layers in the metal interconnect 223. The transistor 227 may include a gate electrode 225 and a gate dielectric 229 disposed over a doped region 228 of the semiconductor substrate 239. Source/drain regions 221 may be provided by adjacent areas of the semiconductor substrate 239 having an opposite doping type.

The ferroelectric capacitor 235 may be operated as a memory cell by applying suitable voltages to a word line (WL), a bit line (BL), and a source line (SL). If the ferroelectric layer 107C has a suitable thickness and mode of operation, it will store data according to the polarization of electrical dipoles. In that case, the ferroelectric capacitor 235 is ferroelectric memory cell. If the ferroelectric layer 107C has a suitable thickness and mode of operation, it will store data according to a charge on the capacitor. In that case, the ferroelectric capacitor 235 is dynamic random-access memory (DRAM) cell.

The ferroelectric layer 107C is a material having compositional alternatives as described for the ferroelectric layer 107A. Likewise, the interlevel dielectric 115C has the compositional alternatives of the interlevel dielectric 115A. The description of the alloy work function metal layer 121A applies to each of the first alloy work function metal layer 121C and the second alloy work function metal layer 121D.

FIGS. 3A through 6 illustrate cross-sectional views exemplifying a method according to the present disclosure of forming a memory cell. While FIGS. 3A through 6 are described with reference to various embodiments of a method, it will be appreciated that the structures shown in FIGS. 3A through 6 are not limited to the method but rather may stand alone separate from the method. While FIGS. 3A through 6 are described as a series of acts, it will be appreciated that the order of the acts may be altered in other embodiments. While FIGS. 3A through 6 illustrate and describe a specific set of acts, some acts that are illustrated and/or described may be omitted in other embodiments. Further, acts that are not illustrated and/or described may be included in other embodiments. While the method of FIGS. 3A through 6 is described in terms of forming the integrated circuit device 100A, the method may be used to form other integrated circuit devices.

Figure 3A:
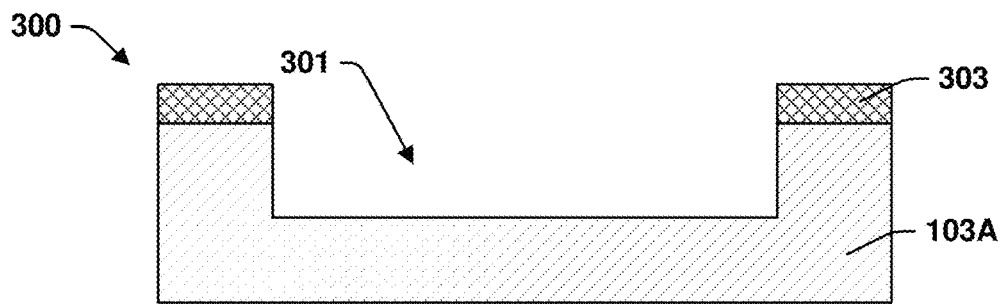
FIGS. 3A-6 are a series of cross-sectional view illustrations exemplifying a method according to the present disclosure of forming a device such as the device of FIG. 1A.

As shown by the cross-sectional view 300 of FIG. 3A, the method may begin with forming a mask 303 and using the match to etch a trench 301 in the substrate 103A. The etch process may be a dry etch. The mask 303 may be formed using photolithography. After etching, the mask 303 may be stripped.

Figure 3B:
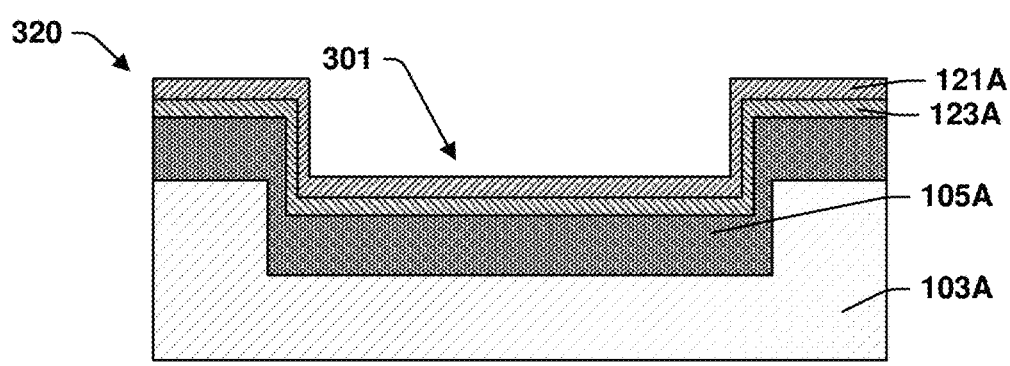

As shown by the cross-sectional view 320 of FIG. 3B, the gate electrode 105A, the second work function metal layer 123A, and the alloy work function metal layer 121A may be deposited in succession so as to fill the trench 301. The alloy work function metal layer 121A is formed by atomic layer deposition (ALD), chemical vapor deposition (CVD), or the like from gaseous precursors and the gaseous precursors are chlorine-free. The second work function metal layer 123A may be deposited by ALD, CVD, physical vapor deposition (PVD), the like, or any other suitable process. In some embodiments, the second work function metal layer 123A is formed by ALD, CVD, or the like from gaseous precursors and the gaseous precursors are chlorine-free. The gate electrode 105A may be formed by ALD, CVD, PVD, electroplating, electroless plating, the like, or any other suitable process. In some embodiments, the gate electrode 105A is formed by ALD, CVD, or the like from gaseous precursors and the gaseous precursors are chlorine-free. Processes that use gaseous precursors are better suited to forming alloys and other complex compositions. ALD allows more accurate control of composition than CVD. In addition, ALD allows precise control of layer thicknesses.

Figure 3C:
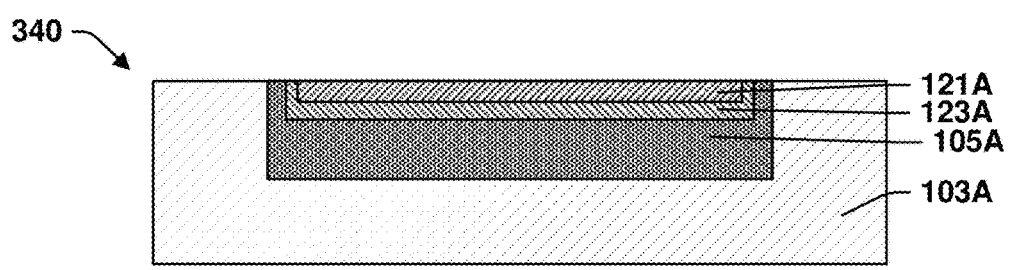

As shown by the cross-sectional view 340 of FIG. 3C, a planarization process may be used to remove portions of the gate electrode 105A, the second work function metal layer 123A, and the alloy work function metal layer 121A that deposited outside the trench 301. The planarization process may be chemical mechanical polishing (CMP) or the like.

Figure 4:
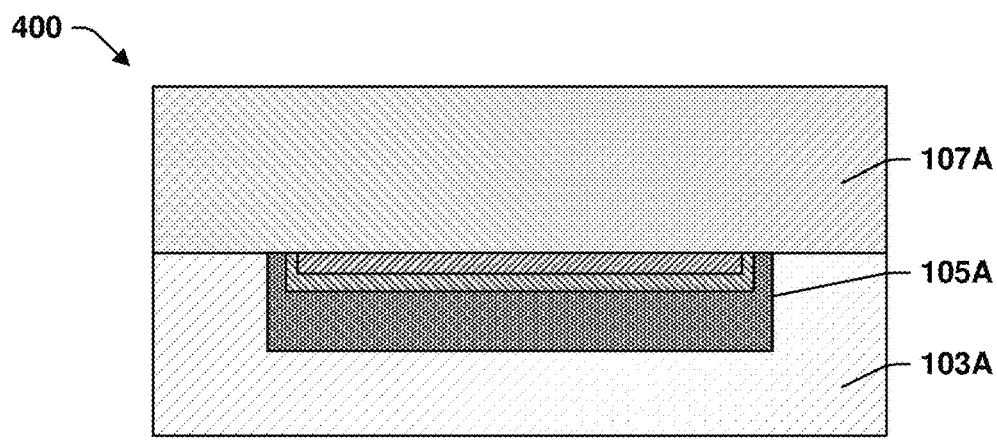

As shown by the cross-sectional view 400 of FIG. 4, the method may continue with forming the ferroelectric layer 107A. The ferroelectric layer 107A is formed by chemical vapor deposition (CVD), atomic layer deposition (ALD), or the like using chlorine-free gaseous precursors. In some embodiments, the ferroelectric layer 107A is formed by ALD as described more fully below. ALD provides precise control of layer thickness and also helps regulate the addition of dopants such as aluminum (Al), silicon (Si), lanthanum (La), scandium (Sc), calcium (Ca), barium (Ba), gadolinium (Gd), yttrium (Y), and the like. When included, these dopants are provided by gaseous chlorine-free precursors.

Figure 5:
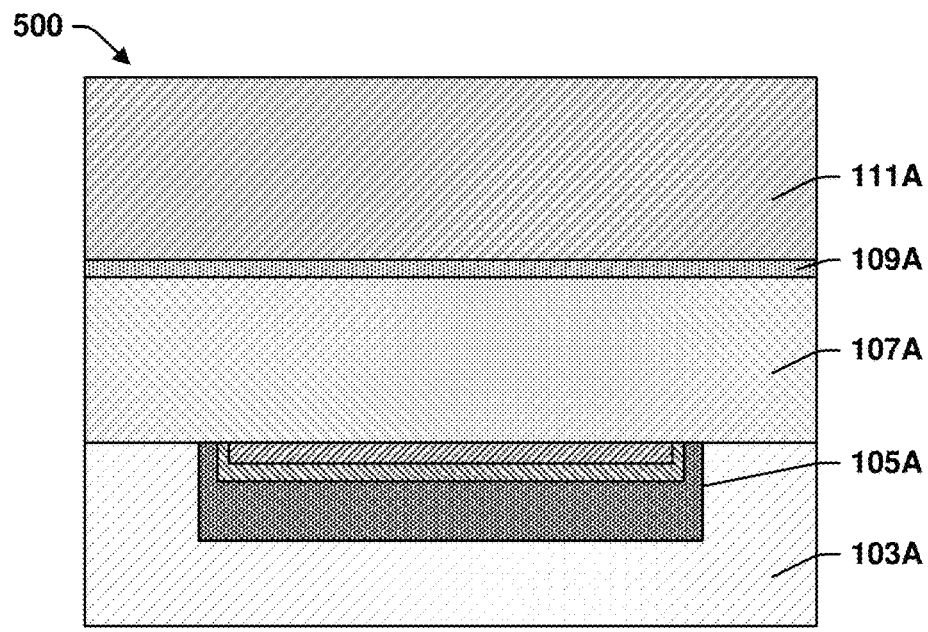

As shown by the cross-sectional view 500 of FIG. 5, the method may continue with forming the insulating layer 109A and the channel layer 111A. The insulating layer 109A and the channel layer 111A may be formed by CVD, ALD, a combination thereof, or the like, or any other suitable process or processes. In some embodiments, these layers are formed from chlorine-free precursors. In some embodiments, the insulating layer 109A is formed by ALD. ALD allows a thickness of the insulating layer to be accurately controlled. CVD and ALD process are conducive to forming the insulating layer with complexes of silicon and a metal or of two or more metals. ALD allows the most accurate control of compositions As shown by the cross-sectional view 600 of FIG. 6, the method may continue with forming the interlevel dielectric 115A over the channel layer 111A. The interlevel dielectric 115A may be formed by CVD, a liquid process such as a spin-on-glass process, or the like. In some embodiments, the interlevel dielectric 115A is undoped silicate glass (USG) formed by CVD with silane (SiH4) or tetraethyl orthosilicate (TEOS).

Figure 6:
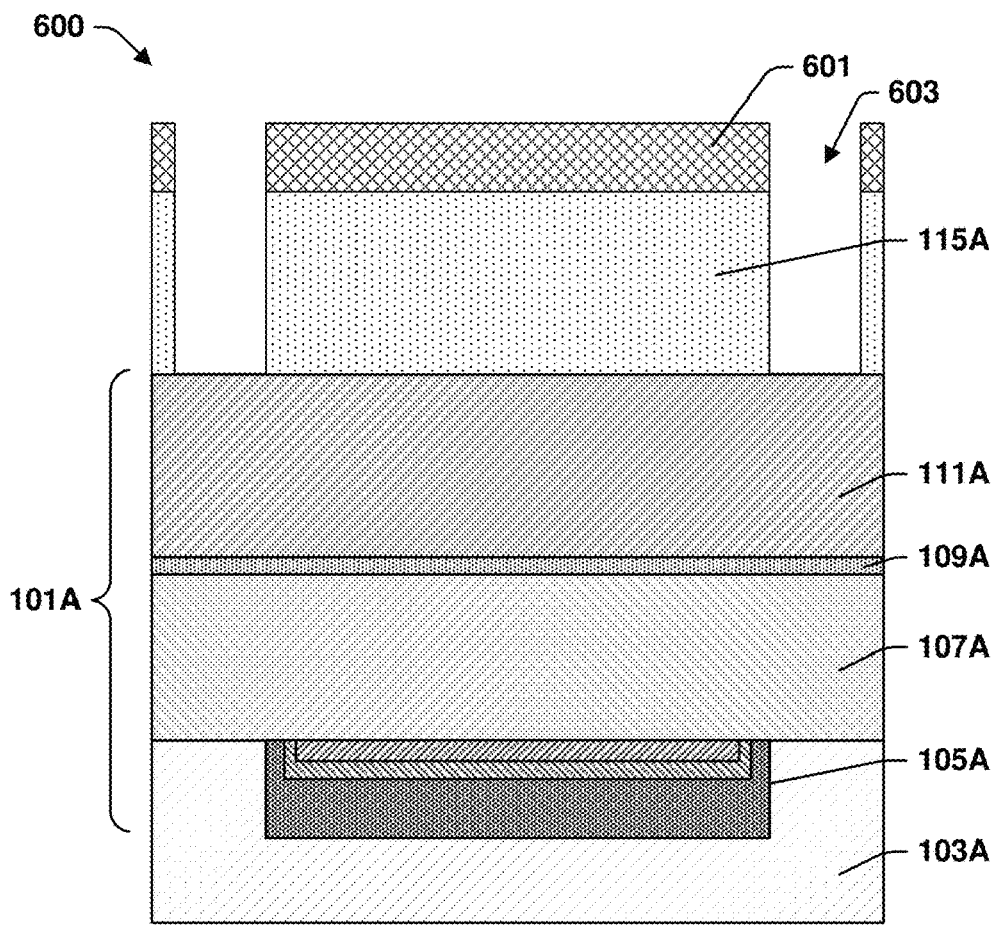

As further shown in FIG. 6, a photoresist mask 601 may be formed and used to etch trenches 603 in the interlevel dielectric 115A. Etching the trenches 603 may include a dry etch process such as plasma etching or any other suitable process. The trenches 603 may be filled with conductive material by atomic layer deposition (ALD), chemical vapor deposition (CVD), physical vapor deposition (PVD), electroplating, electroless plating, the like, or any other suitable process followed by planarization to form a structure as shown in FIG. 1A. Planarization may be CMP or any other suitable process. In some embodiments, the trenches 603 are filled by ALD, CVD, or the like from gaseous precursors and the gaseous precursors are chlorine-free. The use of gaseous precursors and ALD in particular facilitates precise control of the fill composition.

Figure 7:
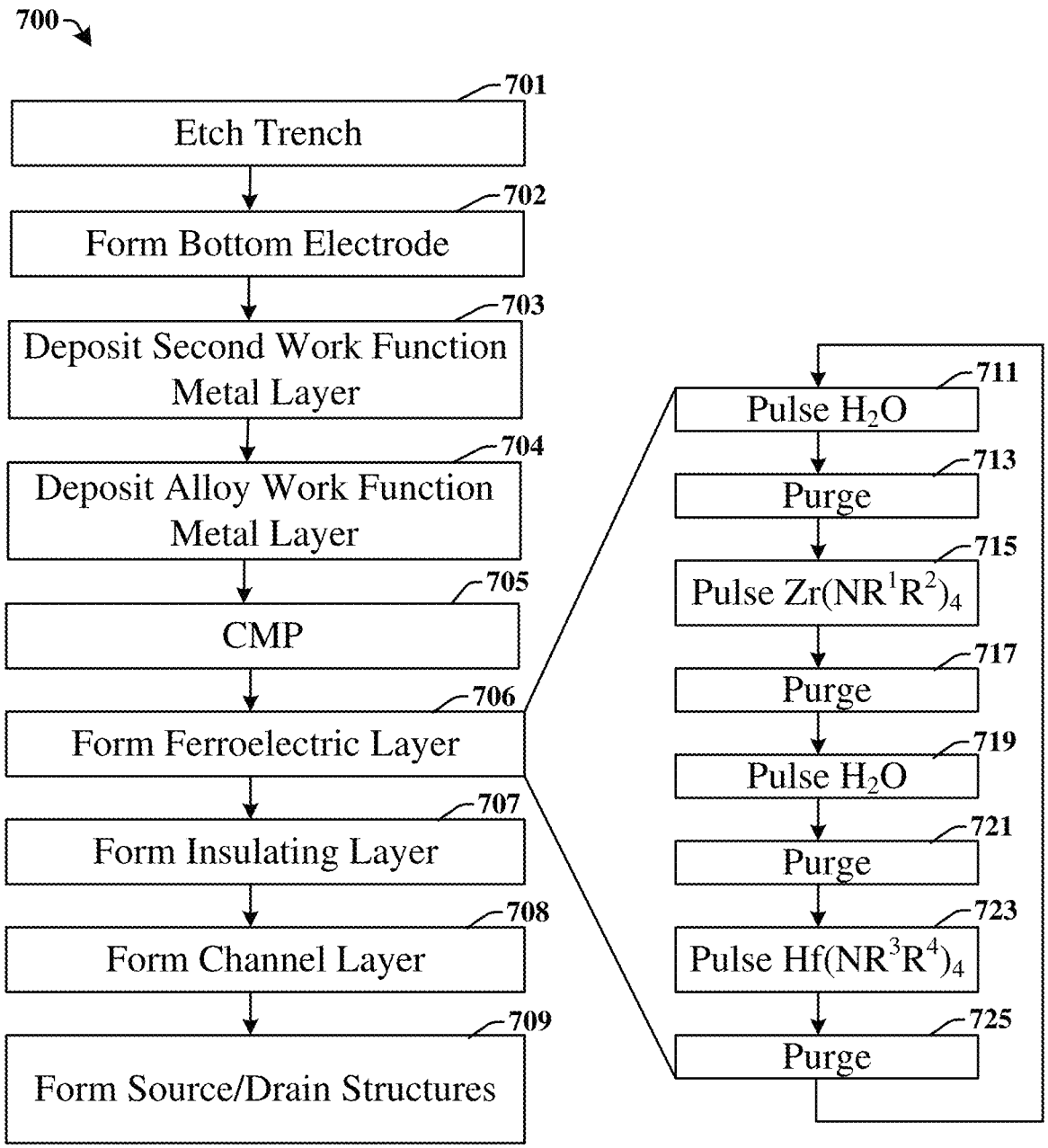
FIG. 7 provides a flow chart illustrating a method according to the present disclosure of forming an integrated circuit device including a ferroelectric layer according to the present disclosure.

FIG. 7 presents a flow chart for a process 700 which may be used to form an integrated circuit device according to the present disclosure. The process 700 includes steps for forming the integrated circuit device 100A of FIG. 1A and also includes a method of forming the ferroelectric layer 107A that may be used to form other ferroelectric layers according to other embodiments of the present disclosure. While the process 700 of FIG. 7 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 700 may begin with act 701, etching a trench in a substrate. The cross-sectional view 300 of FIG. 3A provides an example.

The process 700 continues with act 702, forming a bottom electrode, act 703, depositing a second work function metal layer, and act 704, depositing an alloy work function metal layer. The cross-sectional view 320 of FIG. 3B provides an example. These layers may deposit in the trench formed by act 701. These layers may be formed from chlorine-free gaseous precursors.

Act 705 is chemical mechanical polishing (CMP). The cross-sectional view 340 of FIG. 3C provides an example.

Act 706 is forming the ferroelectric layer. The cross-sectional view 400 of FIG. 4 provides an example. It should be appreciated that a ferroelectric layer according to the present disclosure may be formed in a different structure or at a different stage of processing. Act 706 may include an atomic layer deposition (ALD) process as further illustrated by acts 711 through 725.

After forming the ferroelectric layer, the process 700 may continue with act 707 forming an insulating layer and act 708, forming a channel layer. The cross-sectional view 500 of FIG. 5 provides an illustrative example. Forming the insulating layer is optional. The insulating layer and the channel layer may be formed from chlorine-free gaseous precursors.

Act 709 is forming source and drain structures. The cross-sectional view 600 of FIG. 6 together with FIG. 1A provides an example. The source and drain structures may be formed from chlorine-free gaseous precursors.

Act 706, forming the ferroelectric layer, may be ALD. ALD involves cyclically repeating a series of steps whereby the ferroelectric layer is deposited uniformly and at a controlled rate. As illustrated, the ALD process may begin with act 711, pulsing with water vapor or the like.

Pulsing means introducing the reagent into a process gas flow for a limited period of time. The process gas may include an inert carrier, such as nitrogen or argon that flows continuously through a chamber that contains the substrate. The chamber may be continuously exhausted through a vacuum system. In some embodiments, the ALD process is carried out at sub-atmospheric pressure. In some embodiments, the process is carried out at a pressure at or below 50 torr. In some embodiments, the process is carried out at pressures in the range from about 1 torr to about 10 torr. In some embodiments, the process is carried out at pressures in the range from about 2 torr to about 5 torr. Lower pressures facilitate maintaining precursors in gaseous form.

Through absorption or adsorption, a layer of the water vapor forms on a surface of the substrate. The water provides an oxygen source in chemical reactions that form the ferroelectric layer. Another suitable oxygen source may be substituted for water, such as $O_2$, $O_3$ or plasma $O_2$ or plasma $O_3$. The pulse is continued until the surface layer has formed. In some embodiments, the water pulse is 60 seconds or less. In some embodiments, the water pulse is in the range from one second to 10 seconds.

After the water has formed a layer on the surface, the process may continue with act 713, purging the chamber. Purging the chamber may be purging with a non-reactive gas. Nitrogen may be a non-reactive gas. In some embodiments, the purge lasts 30 seconds or less. In some embodiments, the purge lasts from one second to 10 seconds. In some embodiments, the purge lasts 5 seconds or less.

The process may continue with act 715, pulsing with a chlorine-free zirconium precursor. The chlorine-free zirconium precursor is a zirconium compound that reacts with the oxygen source on the surface to form a layer that includes zirconium. The precursor is selected to be volatile under the process conditions, to deposit only to an extent limited by the amount of the oxygen source such as water that is present on the surface, and to have an acceptable reaction rate. In some embodiments, the zirconium precursor pulse lasts 60 seconds or less. In some embodiments, the zirconium precursor pulse lasts from 0.5 seconds to 10 seconds. In some embodiments, the zirconium precursor pulse lasts from about 1 second to about 5 seconds.

In some embodiments, the zirconium precursor is a zirconium compound in which the zirconium is directly bonded to carbon. Bis(methyl-η5-clyclopentadienyl)methoxymethylzirconium ($Zr[CH_3C_5H_4]_2CH_3OCH_3$ or ZRCMMM) is an example. In some embodiments, the zirconium precursor is a zirconium compound in which the zirconium is directly bonded to oxygen. Zirconium(IV) tert-butoxide ($Zr[OC(CH_3)_3]_4$ or ZTB) is an example. In some embodiments, the zirconium precursor is a zirconium compound in which the zirconium is directly bonded to nitrogen. In some embodiments, the zirconium precursor has the form $Zr(NR^1R^2)_4$ where and $R^1$ and $R^2$ are organic functional groups. tetrakis(dimethylamino)zirconium(IV) ($Zr[N(CH_3)_2]_4$ or TDMAZ) and tetrakis(ethylmethylamido)zirconium(IV) ($Zr[N(CH_3)(C_2H_5)]_4$ or TEMAZ) are examples. In some embodiments, the zirconium precursor is one of those shown in the following table, or the like:

| | |
|---|---|
| Bis(methyl-η5-clyclopentadienyl)methoxymethylzirconium | Zr[CH$_3$C$_5$H$_4$]$_2$CH$_3$OCH$_3$ |
| Zirconium(IV) tert-butoxide | Zr[OC(CH$_3$)$_3$]$_4$ |
| Tetrakis(dimethylamino)zirconium(IV) | (Zr[N(CH$_3$)$_2$]$_4$ |
| Tetrakis(ethylmethylamido)zirconium(IV) | Zr[N(CH$_3$)(C$_2$H$_5$)]$_4$ |
| Bis(cyclopentadienyl)zirconium(IV) | C$_{10}$H$_{12}$Zr |
| Bis(methyl-η5-clyclopentadienyl)methoxymethylzirconium | Zr(CH$_3$C$_5$H$_4$)$_2$CH$_3$OCH$_3$ |
| Dimethylbis(pentamethylcyclopentadienyl)zirconium(IV) | C$_{22}$H$_{36}$Zr |
| Tetrakis(dimethylamido)zirconium(IV) | [(CH$_3$)$_2$N]$_4$Zr |
| Tetrakis(ethylmethylamido)zirconium(IV) | Zr(NCH$_3$C$_2$H$_5$)$_4$ |
| Zirconium(IV) dibutoxide(bis-2,4-pentanedionate) | C$_{18}$H$_{32}$O$_6$Zr |
| Zirconium(IV) 2-ethylhexanoate | Zr(C$_8$H$_{15}$O$_2$)$_4$ |
| Zirconium tetrakis(2,2,6,6-tetramethyl-3,5-heptanedionate) | Zr(OCC(CH$_3$)$_3$CHCOC(CH$_3$)$_3$)$_4$ |

Following act 715 is act 717, another purge. This purge may be like the purge of act 713. There may then follow act 719, another water pulse like act 711, and act 721, another purge. Acts 719 and 721 may be similar or identical to acts 711 and 713 and have the same description.

The process may continue with act 723, pulsing with a chlorine-free hafnium precursor. The chlorine-free hafnium precursor is a hafnium compound that reacts with the oxygen source on the surface to form a layer that includes hafnium. The precursor is selected to be volatile under the process conditions, to deposit only to an extent limited by the amount of water or the like present on the surface, and to have an acceptable reaction rate. In some embodiments, the hafnium precursor pulse lasts 60 seconds or less. In some embodiments, the hafnium precursor pulse lasts from 0.5 seconds to 10 seconds. In some embodiments, the hafnium precursor pulse lasts from about 1 second to about 5 seconds.

In some embodiments, the hafnium precursor is a hafnium compound in which the hafnium is directly bonded to carbon. Bis(methyl-η5-clyclopentadienyl)dimethylhafnium (Hf[CH$_3$C$_5$H$_4$]$_2$CH$_3$OCH$_3$ or HfD-CO2) and bis(methyl-η5-clyclopentadienyl)methoxymethylhafnium (HfCH$_3$OCH$_3$[C$_5$H$_4$]$_2$ or HfD-CO4) are examples. In some embodiments, the hafnium precursor is a hafnium compound in which the hafnium is directly bonded to oxygen. In some embodiments, the hafnium precursor is a hafnium compound in which the hafnium is directly bonded to nitrogen. In some embodiments, the hafnium precursor has the form Hf(NR$^1$R$^2$)$_4$, where R$^1$ and R$^2$ are organic functional groups. Tetrakis(dimethylamino)hafnium(IV) (Hf[N(CH$_3$)$_2$]$_4$ or TDMAH) and tetrakis(ethylmethylamido)hafnium(IV) (Hf[N(CH$_3$)(C$_2$H$_5$)]$_4$ or TEMAH) are examples. In some embodiments, the hafnium precursor is one or more of those described in the following table, or the like:

| | |
|---|---|
| Bis(methyl-η5-clyclopentadienyl)dimethylhafnium | Hf[CH$_3$C$_5$H$_4$]$_2$CH$_3$OCH$_3$ |
| Bis(methyl-η5-clyclopentadienyl)methoxymethylhafnium | HfCH$_3$OCH$_3$[C$_5$H$_4$]$_2$ |
| Tetrakis(dimethylamino)hafnium(IV) | (Hf[N(CH3)$_2$]$_4$ |
| tetrakis(ethylmethylamido)hafnium(IV) | Hf[N(CH$_3$)(C$_2$H$_5$)]$_4$ |
| Dimethylbis(cyclopentadienyl)hafnium(IV) | (C$_5$H$_5$)$_2$Hf(CH$_3$)$_2$ |
| Hafnium(IV) tert-butoxide | Hf[OC(CH$_3$)$_3$]$_4$ |
| Hafnium isopropoxide isopropanol | C$_{12}$H$_{28}$HfO$_4$ |
| Tetrakis(diethylamido)hafnium(IV) | [(CH$_2$CH$_3$)$_2$N]$_4$Hf |
| Tetrakis(dimethylamido)hafnium(IV) | [(CH$_3$)$_2$N]$_4$Hf |
| Tetrakis(ethylmethylamido)hafnium(IV) | [(CH$_3$)(C$_2$H$_5$)N]$_4$Hf |

Following act 723 is act 725, another purge and a repetition of the steps until the ferroelectric layer has been built up to a desired thickness. In the process as described, the actions that incorporate zirconium into the ferroelectric layer alternate with actions that incorporate hafnium into the ferroelectric layer. Optionally, the proportions of these actions are varied, or only the actions that incorporate zirconium are used or only the actions that incorporate halfnium are used. In some embodiments, one layer is deposited every 60 seconds or at a greater frequency. Selection of suitable precursors allows the desired rate to be achieved.

In some embodiments, an additional precursor that provides a metal ion is included with either the zirconium precursor or the hafnium precursor. Examples of metal ions that may be provided by the additional precursor include ions of aluminum (Al), silicon (Si), lanthanum (La), scandium (Sc), calcium (Ca), barium (Ba), gadolinium (Gd), yttrium (Y), and the like. In some embodiments the precursor is one of those shown in the following table, or the like:

| | |
|---|---|
| Aluminum tris(2,2,6,6-tetramethyl-3,5-heptanedionate) | $Al(OCC(CH_3)_3CHCOC(CH_3)_3)_3$ |
| Triisobutylaluminum | $Al[(CH_3)_2CHCH_2]_3$ |
| Trimethylaluminum | $Al(CH_3)_3$ |
| Tris(dimethylamido)aluminum(III) | $Al(N(CH_3)_2)_3$ |
| (3-Aminopropyl)triethoxysilane | $H_2N(CH_2)_3Si(OC_2H_5)_3$ |
| N-sec-Butyl(trimethylsilyl)amine | $C_7H_{19}NSi$ |
| 1,3-Diethyl-1,1,3,3-tetramethyldisilazane | $C_8H_{23}NSi_2$ |
| Dodecamethylcyclohexasilane | $(Si(CH_3)_2)_6$ |
| Hexamethyldisilane | $(Si(CH_3)_3)_2$ |
| Hexamethyldisilazane | $(CH_3)_3SiNHSi(CH_3)_3$ |
| 2,4,6,8,10-Pentamethylcyclopentasiloxane | $(CH_3SiHO)_5$ |
| Pentamethyldisilane | $(CH3)_3SiSi(CH_3)_2H$ |
| Silicon tetrabromide | $SiBr_4$ |
| Tetraethylsilane | $Si(C_2H_5)_4$ |
| 2,4,6,8-Tetramethylcyclotetrasiloxane | $(HSiCH_3O)_4$ |
| 1,1,2,2-Tetramethyldisilane | $(CH_3)_2SiHSiH(CH_3)_2$ |
| Tetramethylsilane | $Si(CH_3)_4$ |
| N,N',N''-Tri-tert-butylsilanetriamine | $HSi(HNC(CH_3)_3)_3$ |
| Tris(tert-butoxy)silanol | $((CH_3)_3CO)_3SiOH$ |
| Tris(tert-pentoxy)silanol | $(CH_3CH_2C(CH_3)_2O)_3SiOH$ |
| Tris[N,N-Bis(trimethylsilyl)amide]gadolinium(III) | $Gd(N(Si(CH_3)_3)_2)_3$ |
| Tris(tetramethylcyclopentadienyl)gadolinium(III) | $C_{27}H_{39}Gd$ |
| Tris(isopropylcyclopentadienyl)gadolinium | $C_{24}H_{33}Gd$ |
| Triethylgallium | $(CH_3CH_2)_3Ga$ |
| Trimethylgallium | $Ga(CH_3)_3$ |
| Tris(dimethylamido)gallium(III) | $C_{12}H_{36}Ga_2N_6$ |
| Lanthanum(III) isopropoxide | $C_9H_{21}LaO_3$ |
| Tris[N,N-bis(trimethylsilyl)amide]lanthanum(III) | $La(N(Si(CH_3)_3)_2)_3$ |
| Tris(cyclopentadienyl)lanthanum(III) | $La(C_5H_5)_3$ |
| Lanthanum (2,2,6,6-tetramethyl-3,5-heptanedionato) | $La(OCC(CH_3)_3CHCOC(CH_3)_3)_3$ |
| Tris(tetramethylcyclopentadienyl)lanthanum(III) | $C_{27}H_{39}La$ |
| Tris[N,N-bis(trimethylsilyl)amide]yttrium | $[[(CH_3)_3Si]_2N]_3Y$ |
| Tris(butylcyclopentadienyl)yttrium(III) | $Y(C_5H_4CH_2(CH_2)_2CH_3)_3$ |
| Tris(cyclopentadienyl)yttrium(III) | $Y(C_5H_5)_3$ |
| Yttrium 2-methoxyethoxide | $C_9H_{21}O_6Y$ |
| Yttrium(III) tris(isopropoxide) | $C_9H_{21}O_3Y$ |
| Yttrium(III) tris(2,2,6,6-tetramethyl-3,5-heptanedionate) | $Y(OCC(CH_3)_3CHCOC(CH_3)_3)_3$ |

In some embodiments, the metal ion is aluminum (Al) or the like. In some embodiments, the metal ion is silicon (Si) or the like. In some embodiments, the metal ion is lanthanum (La) or the like. In some embodiments, the metal ion is gadolinium (Gd) or the like. In some embodiments, the metal ion is yttrium (Y) or the like. In some embodiments, the additional precursor includes the metal ion directly bonded to oxygen, nitrogen, carbon, or a combination thereof. In some embodiments, the additional precursor includes the metal ion directly bonded to carbon. In some embodiments, the additional precursor includes the metal ion directly bonded to oxygen. In some embodiments, the additional precursor includes the metal ion directly bonded exclusively to oxygen and/or carbon. In some embodiments, the additional precursor includes the metal ion directly bonded to nitrogen.

FIGS. 8 through 13 illustrate cross-sectional views exemplifying another method according to the present disclosure of forming a memory cell. While FIGS. 8 through 13 are described with reference to various embodiments of a method, it will be appreciated that the structures shown in FIGS. 8 through 13 are not limited to the method but rather may stand alone separate from the method. While FIGS. 8 through 13 are described as a series of acts, it will be appreciated that the order of the acts may be altered in other embodiments. While FIGS. 8 through 13 illustrate and describe a specific set of acts, some acts that are illustrated and/or described may be omitted in other embodiments. Further, acts that are not illustrated and/or described may be included in other embodiments. While the method of FIGS. 8 through 13 is described in terms of forming the integrated circuit device 100B, the method may be used to form other integrated circuit devices.

Figure 8:
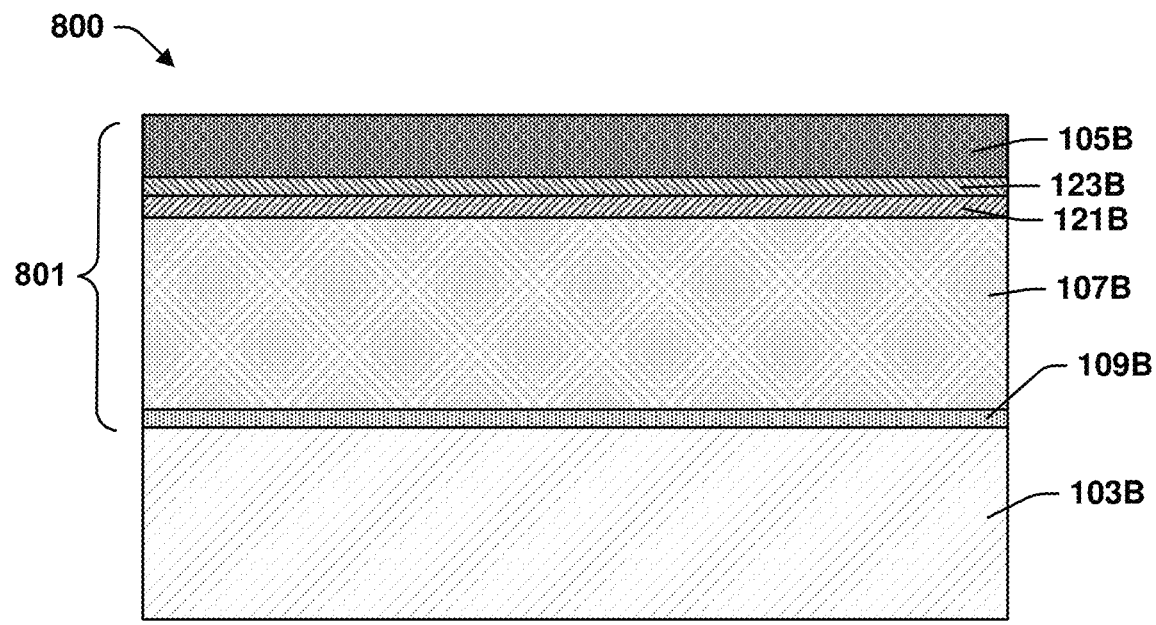
FIGS. 8-13 are a series of cross-sectional view illustrations exemplifying a method according to the present disclosure of forming a device such as the device of FIG. 1B.

As shown by the cross-sectional view 800 of FIG. 8, the method may begin with forming a memory cell stack 801 on the substrate 103B. The memory cell stack 801 may include an insulating layer 109B, a ferroelectric layer 107B, an alloy work function metal layer 121B, a second work function metal layer 123B, and a gate electrode 105B. The process options for forming these layers are the same as for the insulating layer 109A, the ferroelectric layer 107A, the alloy work function metal layer 121A, the second work function metal layer 123A, and the gate electrode 105A respectively.

Figure 9:
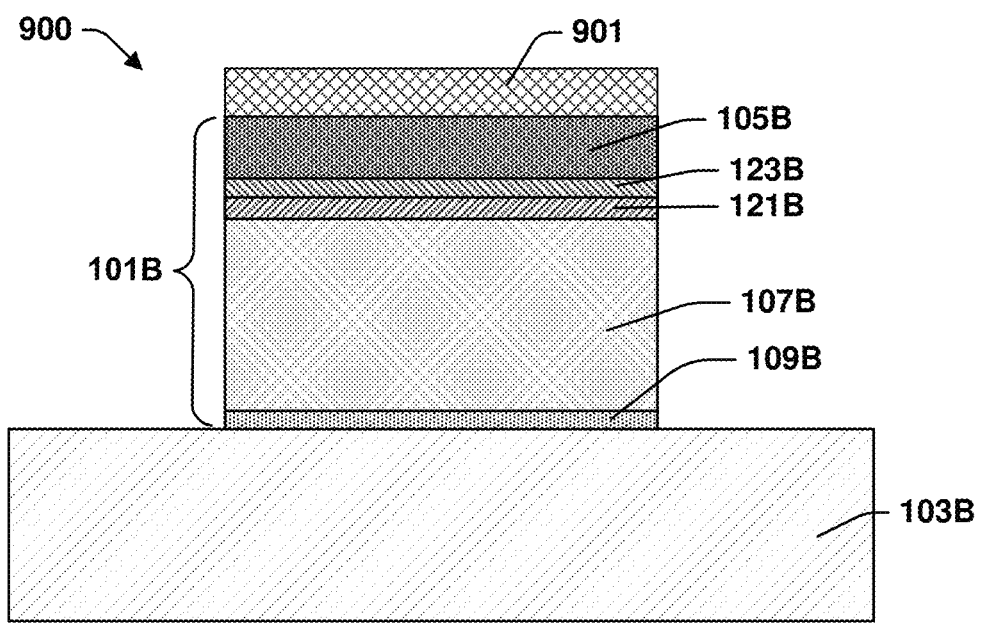

As shown by the cross-sectional view 900 of FIG. 9, a mask 901 may be formed and used to pattern the memory cell 101B from the memory cell stack 801. The mask 901 may be formed with photolithography. Patterning may include dry etching. After patterning, the mask 901 may be stripped.

Figure 10:
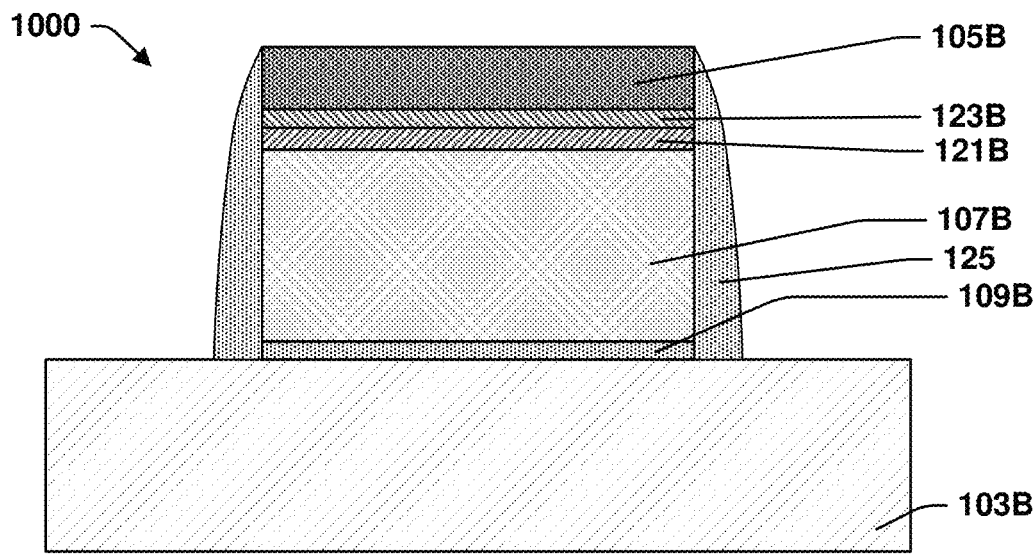

As shown by the cross-sectional view 1000 of FIG. 10, a sidewall spacer 125 may be formed around the memory cells 101B. Forming the sidewall spacer 125 may comprise depositing a spacer material such as silicon nitride (SiN) or the like followed by etching.

Figure 11:
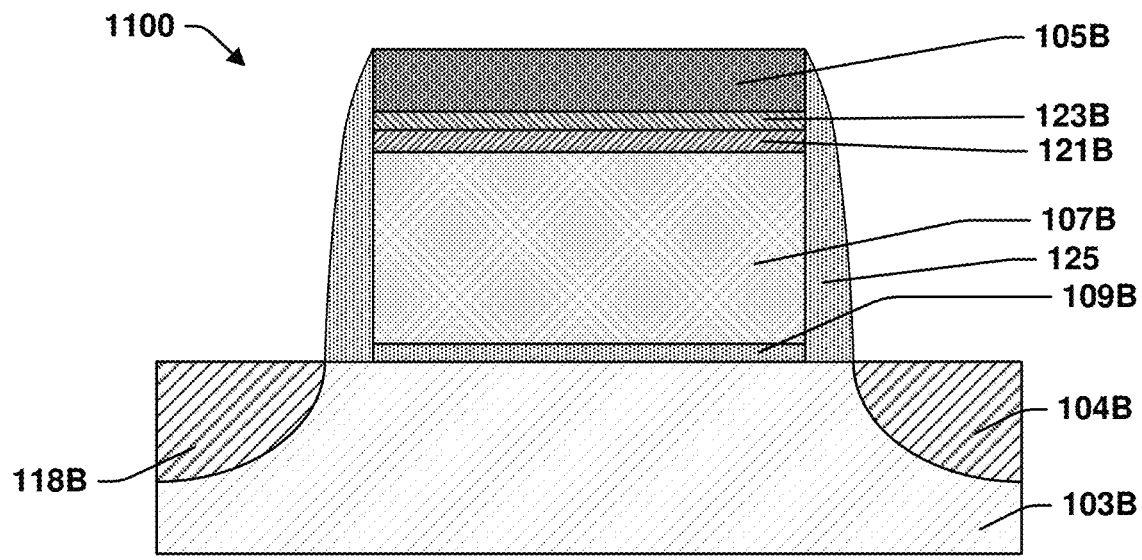

As shown by the cross-sectional view 1100 of FIG. 11, the source region 118B and the drain region 104B may be dopped in a self-aligned doping process using the sidewall spacer 125.

Figure 12:
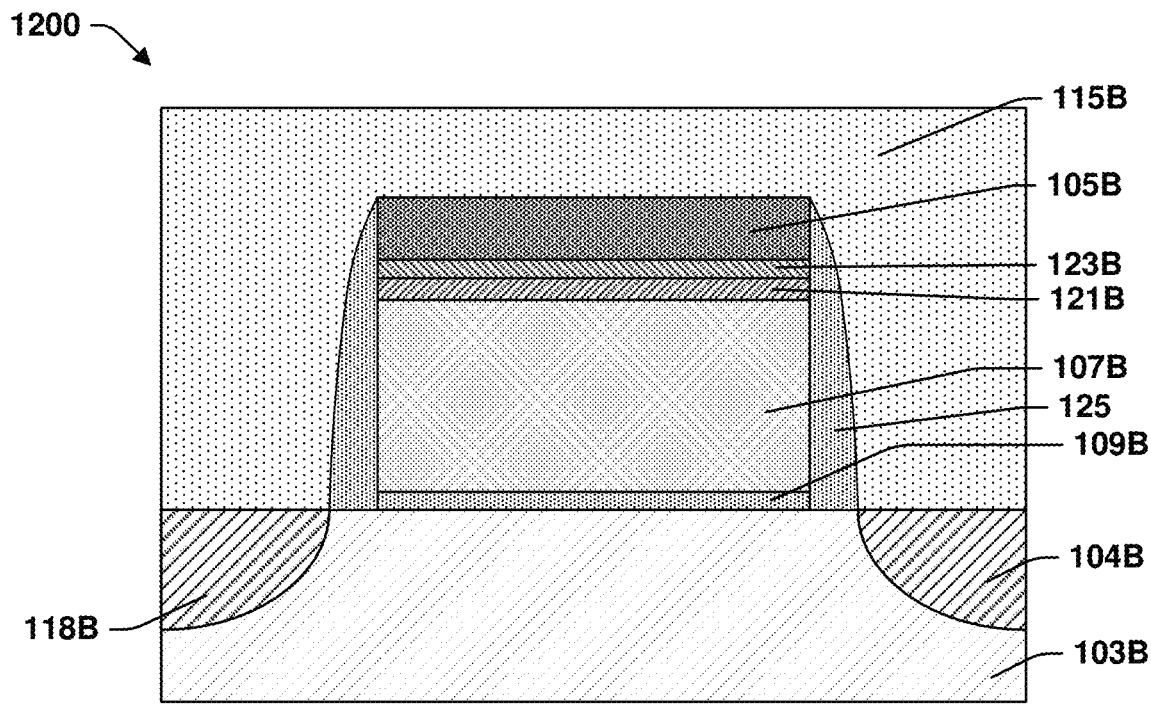

As shown by the cross-sectional view 1200 of FIG. 12, an interlevel dielectric 115B may be formed over and around the memory cell 101B. The process options for forming the interlevel dielectric 115B are the same as for the interlevel dielectric 115A.

Figure 13:
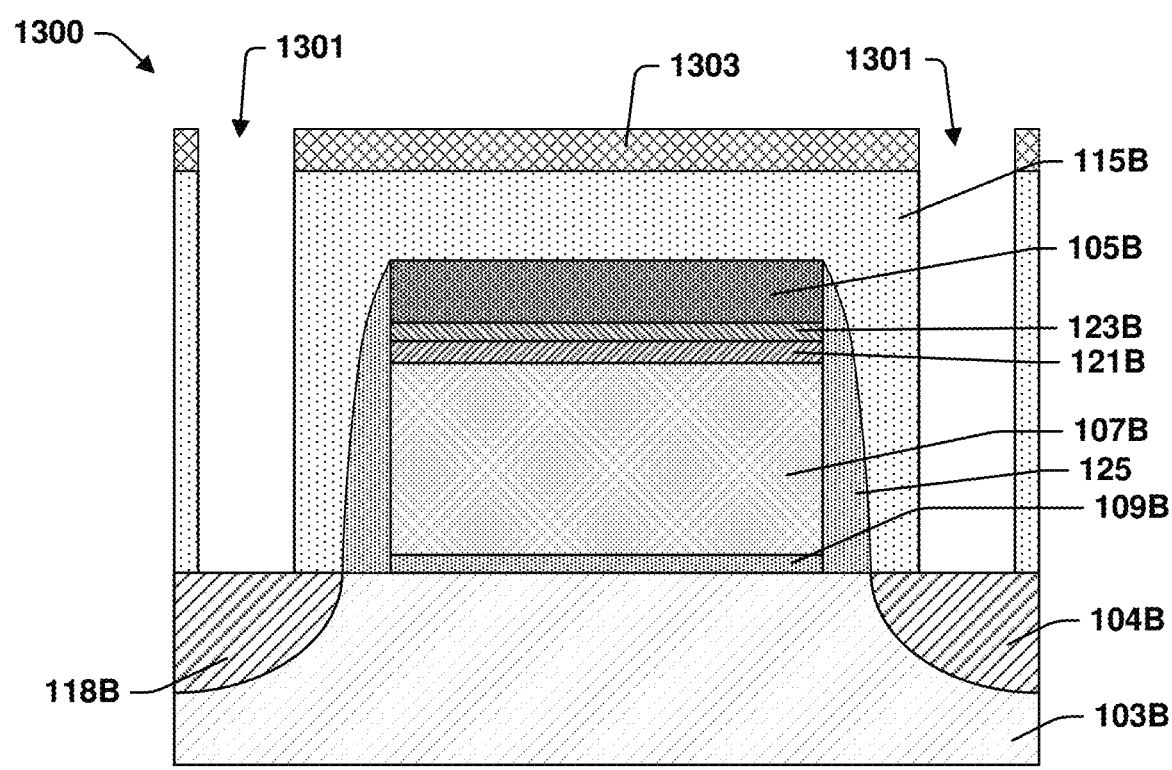

As shown by the cross-sectional view 1300 of FIG. 13, a mask 1303 maybe formed using photolithography and used to pattern opening 1301 in the interlevel dielectric 115B. The openings 1301 may be filled to form the source coupling 117B and the drain coupling 113B as shown in FIG. 1B. The process options for filling the opening 1301 to form the source coupling 117B and the drain coupling 113B are the same as the ones for filling the trenches 603 (see FIG. 6) to form the source coupling 117A and the drain coupling 113B.

Figure 14:
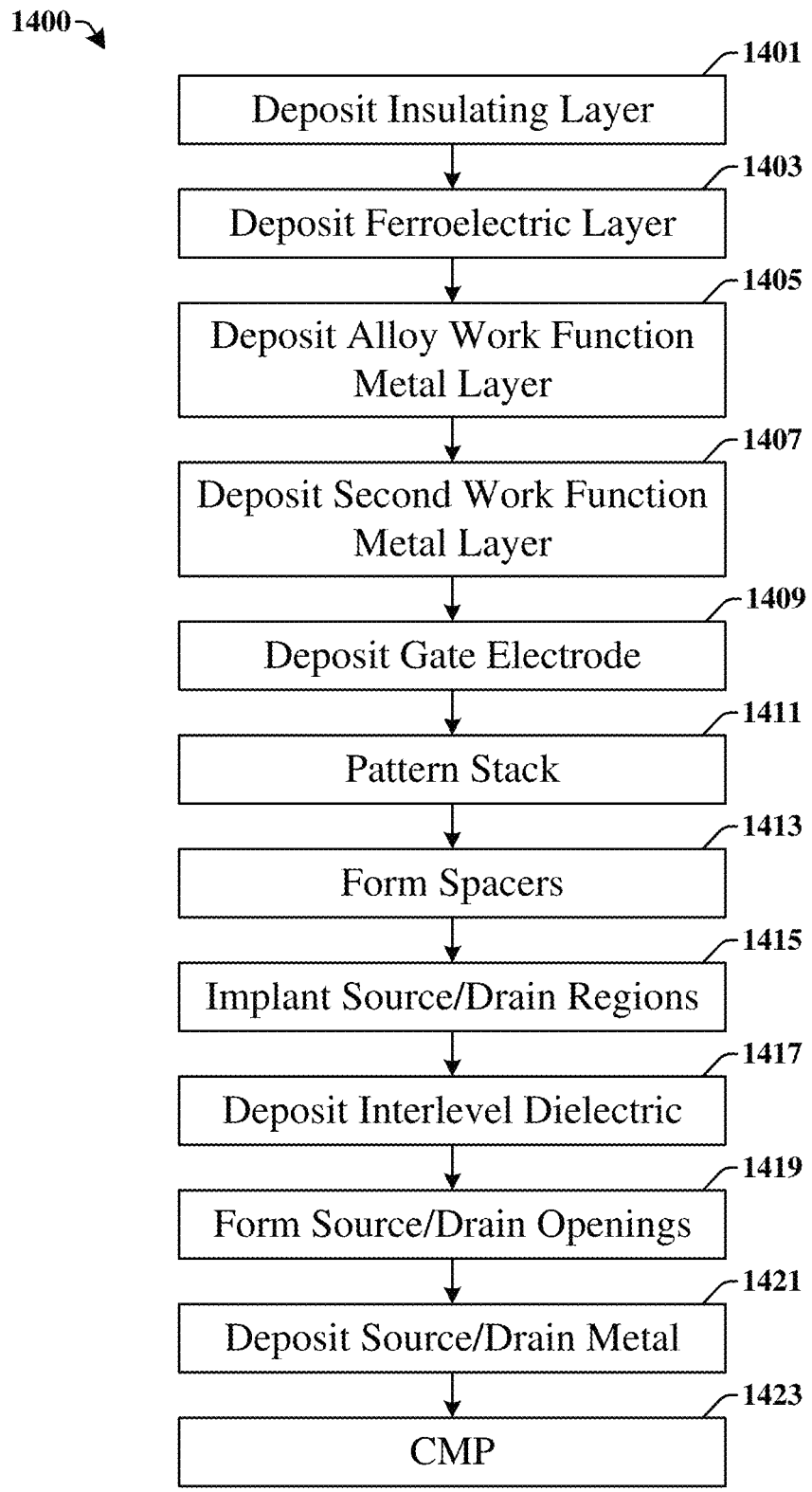
FIG. 14 provides a flow chart illustrating a method according to the present disclosure of forming an integrated circuit device including a ferroelectric layer according to the present disclosure.

FIG. 14 presents a flow chart for a process 1400 which may be used to form an integrated circuit device according to the present disclosure. The process 1400 includes steps for forming the integrated circuit device 100B of FIG. 1B. While the process 1400 of FIG. 14 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 1400 begins with acts 1401 through 1409, which form a memory cell stack such as the one illustrated by the cross-sectional view 800 of FIG. 8. Act 1401 is depositing an insulating layer, act 1403 is depositing a ferroelectric layer, act 1405 is depositing an alloy work function metal layer, act 1407 is depositing a second work function metal layer, and act 1409 is depositing a gate electrode. These may be substantially the same as act 707, act 706, act 704, act 703, and act 702 respectively of the process 700.

Act 1411 is patterning the memory cell stack to define memory cells. The cross-sectional view 900 of FIG. 9 provides an example.

Act 1413 is forming spacers around the memory cells. The cross-sectional view 1000 of FIG. 10 provides an example.

Act 1415 is implanting source and drain regions adjacent the memory cells. The cross-sectional view 1100 of FIG. 11 provides an example.

Act 1417 is depositing an interlevel dielectric over and around the memory cells. The cross-sectional view 1200 of FIG. 12 provides an example.

Act 1419 is forming openings in the interlevel dielectric for source and drain connections. The cross-sectional view 1300 of FIG. 13 provides an example.

Act 1421 is filling the openings with conductive material to form source and drain connection. Act 1423 is CMP. FIG. 1B provides an example of a resulting structure.

In some embodiments titanium (Ti), titanium nitride (TiN), or some other compound that includes titanium is formed from chlorine-free gaseous precursors. Examples of chlorine-free gaseous precursors that may be used to form layers with titanium (Ti), titanium nitride (TiN), the like, or other titanium compounds include tetrakis(diethylamido) titanium(IV) ($[(C_2H_5)_2N]_4Ti$), tetrakis(dimethylamido)titanium(IV) ($[(CH_3)_2N]_4Ti$), tetrakis(ethylmethylamido)titanium(IV) ($[(CH_3C_2H_5)N]_4Ti$), titanium(IV) diisopropoxidebis (2,2,6,6-tetramethyl-3,5-heptanedionate) ($Ti[OCC(CH_3)_3 CHCOC(CH_3)_3]_2(OC_3H_7)_2$), and the like.

In some embodiments molybdenum (Mo), molybdenum nitride (MoN), or some other compound that includes molybdenum is formed from chlorine-free gaseous precursors. Examples of chlorine-free gaseous precursors that may be used to form layers with molybdenum (Mo), molybdenum nitride (MoN), the like, or other molybdenum compounds include cyclopentadienyl molybdenum tricarbonyl dimer ($C_{16}H_{10}Mo_2O_6$), molybdenumhexacarbonyl ($Mo(CO)_6$), and the like.

In some embodiments nickel (Ni) or a compound that includes nickel is formed from chlorine-free gaseous precursors. Examples of chlorine-free gaseous precursors that may be used to form layers with nickel (Ni) or nickel compounds include bis(cyclopentadienyl)nickel(II) ($Ni(C_5H_5)_2$), bis(ethylcyclopentadienyl)nickel(II) ($Ni(C_5H_4C_2H_5)_2$), nickel(II) bis(2,2,6,6-tetramethyl-3,5-heptanedionate) ($Ni(OCC(CH_3)_3CHCOC(CH_3)_3)_2$), and the like.

In some embodiments aluminum (Al), aluminum nitride (AlN), or some other compound that includes aluminum is formed from chlorine-free gaseous precursors. Examples of chlorine-free gaseous precursors that may be used to form layers with aluminum (Al), aluminum nitride (AlN), the like, or other aluminum compounds include aluminum tris (2,2,6,6-tetramethyl-3,5-heptanedionate) ($Al(OCC(CH_3)_3 CHCOC(CH_3)_3)_3$), triisobutylaluminum ($[(CH_3)_2CHCH_2]_3 Al$), trimethylaluminum (($CH_3)_3Al$), tris(dimethylamido) aluminum(III) ($Al(N(CH_3)_2)_3$), and the like In some embodiments copper (Cu) or a compound that includes copper is formed from chlorine-free gaseous precursors. Examples of chlorine-free gaseous precursors that may be used to form layers with copper (Cu) or copper compounds include copper bis(6,6,7,7,8,8,8-heptafluoro-2, 2-dimethyl-3,5-octanedionate) (Cu(OCC $(CH_3)_3CHCOCF_2CF_2CF_3)_2$), copper bis(2,2,6,6-tetramethyl-3,5-heptanedionate) ($Cu(OCC(CH_3)_3CHCOC(CH_3)_3)_2$), and the like.

In some embodiments platinum (Pt) or a compound that includes platinum is formed from chlorine-free gaseous precursors. Examples of chlorine-free gaseous precursors that may be used to form layers with platinum (Pt) or platinum compounds include trimethyl(methylcyclopentadienyl)platinum(IV) ($C_5H_4CH_3Pt(CH_3)_3$) and the like.

In some embodiments ruthenium (Ru) or a compound that includes ruthenium is formed from chlorine-free gaseous precursors. Examples of chlorine-free gaseous precursors that may be used to form layers with ruthenium (Ru) or ruthenium compounds include bis(cyclopentadienyl)ruthenium(II) ($C_{10}H_{10}Ru$), bis(ethylcyclopentadienyl)ruthenium (II) ($C_7H_9RuC_7H_9$), triruthenium dodecacarbonyl ($Ru_3(CO)_{12}$)

In some embodiments tantalum (Ta), tantalum nitride (TaN), or some other compound that includes tantalum is formed from chlorine-free gaseous precursors. Examples of chlorine-free gaseous precursors that may be used to form layers with tantalum (Ta), tantalum nitride (TaN), the like, or other tantalum compounds include pentakis(dimethylamino)tantalum(V) ($Ta(N(CH_3)_2)_5$), tantalum(V) ethoxide ($Ta(OC_2H_5)_5$), tris(diethylamido)(tert-butylimido)tantalum(V) ($(CH_3)_3CNTa(N(C_2H_5)_2)_3$), tris(ethylmethylamido)(tert-butylimido)tantalum(V) ($C_{13}H_{33}N_4Ta$), and the like.

In some embodiments tungsten (W), tungsten nitride (WN), tungsten carbonitride (WCN), or some other compound that includes tungsten is formed from chlorine-free gaseous precursors. Examples of chlorine-free gaseous precursors that may be used to form layers with tungsten (W), tungsten nitride (WN), tungsten carbonitride (WCN), the like, or other tungsten compounds include bis(tert-butylimino)bis(tert-butylamino)tungsten ($(C_4H_9NH)_2W(C_4H_9N)_2$), bis(tert-butylimino)bis(dimethylamino)tungsten(VI) ($((CH_3)_3CN)_2W(N(CH_3)_2)_2$), bis(cyclopentadienyl)tungsten (IV) dihydride ($C_{10}H_{12}W$), bis(isopropylcyclopentadienyl)tungsten(IV) dihydride ($(C_5H_4CH(CH_3)_2)_2WH_2$), tetracarbonyl(1,5-cyclooctadiene)tungsten(0) ($C_{12}H_2O_4W$), tungsten hexacarbonyl ($W(CO)_6$), and the like.

In some embodiments, a gaseous chlorine-free metal precursor is a metal compound having a hydrocarbon functional group. Each of the foregoing examples of chlorine-free metal precursors is an example in which the chlorine-free metal precursors is a metal compound having a hydrocarbon functional group.

In some embodiments, a gaseous chlorine-free metal precursor is a metal compound having a carbonyl functional group. Example in which the gaseous chlorine-free metal precursor is a metal compound having a carbonyl function group include cyclopentadienyl molybdenum tricarbonyl dimer ($C_{16}H_{10}Mo_2O_6$), molybdenumhexacarbonyl ($Mo(CO)_6$), triruthenium dodecacarbonyl ($Ru_3(CO)_{12}$), bis(isopropylcyclopentadienyl)tungsten(IV) dihydride ($(C_5H_4CH(CH_3)_2)_2WH_2$), tungsten hexacarbonyl ($W(CO)_6$), and the like. These compounds may have particularly high deposition rates.

In some embodiments, a gaseous chlorine-free metal precursor is cyclopentadienyl complex. Example in which the chlorine-free metal precursor is a cyclopentadienyl complex include cyclopentadienyl molybdenum tricarbonyl dimer ($C_{16}H_{10}Mo_2O_6$), bis(cyclopentadienyl)nickel(II) ($Ni(C_5H_5)_2$), bis(ethylcyclopentadienyl)nickel(II) ($Ni(C_5H_4C_2H_5)_2$), trimethyl(methylcyclopentadienyl)platinum (IV) ($C_5H_4CH_3Pt(CH_3)_3$), bis(cyclopentadienyl)ruthenium (II) ($C_{10}H_{10}Ru$), bis(ethylcyclopentadienyl)ruthenium(II) ($C_7H_9RuC_7H_9$), bis(cyclopentadienyl)tungsten(IV) dihydride ($C_{10}H_{12}W$), bis(isopropylcyclopentadienyl)tungsten (IV) dihydride ($(C_5H_4CH(CH_3)_2)_2WH_2$), and the like. Many different metals can be formed into cyclopentadienyl complexes. Choosing cyclopentadienyl complexes enhances uniformity and predictability among deposition processes that may be used to form layers having a variety of compositions. In some embodiments, a deposition process uses two cyclopentadienyl complexes corresponding to two distinct metals.

In some embodiments, a gaseous chlorine-free metal precursor is a metal compound having a nitrogen function group. Example in which the chlorine-free metal precursor is a metal compound having a nitrogen function group include tetrakis(diethylamido)titanium(IV) ($[(C_2H_5)_2N]_4Ti$), tetrakis(dimethylamido)titanium(IV) ($[(CH_3)_2N]_4Ti$), tetrakis(ethylmethylamido)titanium(IV) ($[(CH_3C_2H_5)N]_4Ti$), tris(dimethylamido)aluminum(III) ($Al(N(CH_3)_2)_3$), pentakis(dimethylamino)tantalum(V) ($Ta(N(CH_3)_2)_5$), tantalum(V) ethoxide ($Ta(OC_2H_5)_5$), tris(diethylamido)(tert-butylimido)tantalum(V)($(CH_3)_3CNTa(N(C_2H_5)_2)_3$), tris(ethylmethylamido)(tert-butylimido)tantalum(V) ($C_{13}H_{33}N_4Ta$), bis(tert-butylimino)bis(tert-butylamino)tungsten ($(C_4H_9NH)_2W(C_4H_9N)_2$), bis(tert-butylimino)bis(dimethylamino)tungsten(VI) ($((CH_3)_3CN)_2W(N(CH_3)_2)_2$), and the like. These compounds may be particularly useful in forming nitrogen-containing metal compounds.

Some aspects of the present disclosure relate to an integrated circuit device that includes a ferroelectric layer having less than 1 ppm chlorine. In some embodiments, the ferroelectric layer is $HF_xZr_{1-x}O_2$, wherein $0 \le x \le 1$. In some embodiments, the ferroelectric layer. In some embodiments, the layer of ferroelectric is part of a memory cell. In some embodiments a work function metal layer in direct contact with the ferroelectric layer has less than 1 ppm chlorine. In some embodiments the work function metal layer comprises an alloy of two distinct metals. In some embodiments a second work function metal layer is also in direct contact with the ferroelectric layer and has less than 1 ppm chlorine. In some embodiments a gate electrode is also in direct contact with the ferroelectric layer and has less than 1 ppm chlorine.

Some aspects of the present disclosure relate to an integrated circuit device comprising a memory cell that includes a channel extending between a source and a drain, a gate electrode, and a ferroelectric layer between the gate electrode and the channel. The memory cell has a leakage current and a time-dependent dielectric breakdown rate (a TDDB rate). The TDDB rate is defined as an initial value of the leakage current divided by a time of operation over which the leakage current doubles from the initial value. The TDDB rate is less than an amount by which the TDDB rate would increase if 1 ppm of chlorine were added to the ferroelectric layer.

Some aspects of the present disclosure relate to a method of forming an integrated circuit device that includes forming a ferroelectric layer by atomic layer deposition using chlorine-free precursors. In some embodiments the chlorine-free precursors include a zirconium (Zr) precursor or a hafnium (Hf) precursor. In some embodiments, the method further includes forming a work function metal layer from gaseous chlorine-free precursors wherein the work function metal layer comes into direct contact with the ferroelectric layer. In some embodiments, the work function metal layer is an alloy work function metal layer. In some embodiments the gaseous chlorine-free precursors comprise a metal compound with a hydrocarbon functional group. In some embodiments the gaseous chlorine-free precursors comprise a metal compound with a carbonyl functional group. In some embodiments the gaseous chlorine-free precursors comprise a metal compound with a nitrogen functional group. In some embodiments the gaseous chlorine-free precursors comprise a metal in a cyclopentadienyl complex.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit device, the method comprising:
    forming a memory device that includes a ferroelectric layer, wherein:
        the ferroelectric layer is deposited using an atomic layer deposition (ALD) process with exclusively chlorine-free precursors;
        the ferroelectric layer has a top surface that results directly from the ALD process; and
        the chlorine-free precursors include a first metal compound and a second metal compound, wherein the first and second metal compounds contain distinct metals; and
    prior to performing any additional processing on the ferroelectric layer after the ALD process, directly depositing one of the following over and in contact with the top surface:
        a dielectric layer-metal oxide semiconductor layer stack,
        a metal oxide semiconductor layer, or
        a top electrode layer.

2. The method of claim 1, wherein the chlorine-free precursors include a third metal compound, and the third metal compound contains a distinct metal from first and second metal compounds.

3. The method of claim 1, wherein the first metal compound comprises hafnium and the second metal compound comprises zirconium.

4. The method of claim 1, wherein all of the materials in direct contact with the ferroelectric layer are deposited from chlorine-free precursors.

5. The method of claim 4, wherein the materials in direct contact with the ferroelectric layer include an oxide semiconductor and a metal.

6. The method of claim 4, wherein one of the materials in direct contact with the ferroelectric layer comprises titanium or tantalum.

7. The method of claim 4, wherein one of the materials in direct contact with the ferroelectric layer comprises tungsten.

8. A method of forming an integrated circuit device, the method comprising:
    forming a ferroelectric field effect transistor (FeFET) memory device comprising a gate electrode, a semiconductor channel, and a ferroelectric layer disposed between the gate electrode and the semiconductor channel, wherein forming the FeFET comprises:
        depositing the ferroelectric layer by atomic layer deposition (ALD) using exclusively first chlorine-free precursors; and
        depositing a work function metal layer exclusively from second chlorine-free precursors;
        wherein the work function metal layer and the ferroelectric layer are in direct contact.

9. The method of claim 8, wherein the first chlorine-free precursors include a first metal compound and a second metal compound, wherein the first and second metal compounds contain distinct metals.

10. The method of claim 8, wherein the first chlorine-free precursors include a first metal compound, a second metal compound, and a third metal compound, wherein the first, second, and third metal compounds contain distinct metals.

11. The method of claim 8, wherein the second chlorine-free precursors include a first metal compound and a second metal compound, wherein the first and second metal compounds contain distinct metals.

12. The method of claim 8, wherein the semiconductor channel is provided by an oxide semiconductor deposited exclusively from third chlorine-free precursors.

13. The method of claim 8, wherein the FeFET is formed exclusively from chlorine-free precursors.

14. The method of claim 8, wherein the second chlorine-free precursors comprise a tungsten compound with a nitrogen functional group, tungsten compound with a carbonyl functional group, or a tungsten compound in a cyclopentadienyl complex.

15. A method of forming an integrated circuit device, the method comprising:
    forming a capacitor comprising a bottom electrode, a top electrode, and a ferroelectric structure disposed between the bottom electrode and the top electrode, wherein forming the capacitor comprises:
        forming the bottom electrode, wherein forming the bottom electrode comprises depositing a first work function metal layer from exclusively chlorine-free precursors;
        depositing a ferroelectric layer from exclusively chlorine-free precursors, wherein the ferroelectric layer is over and in direct contact with the first work function metal layer; and
        forming the top electrode, wherein forming the top electrode comprises depositing a second work function metal layer from exclusively chlorine-free precursors, wherein the second work function metal layer is over and in direct contact with the ferroelectric layer.

16. The method of claim 15, wherein the top electrode and the bottom electrode each comprise a plurality of layers with distinct compositions, and the top electrode and the bottom electrode are formed exclusively from chlorine-free precursors.

17. The method of claim 15, wherein the first work function metal layer or the second work function metal layer comprises two metals.

18. The method of claim 15, wherein the chlorine-free precursors used to form the ferroelectric layer include a first metal compound and a second metal compound, wherein the first and second metal compounds contain distinct metals.

19. The method of claim 15, wherein the first work function metal layer or the second work function metal layer comprises tantalum or titanium.

20. The method of claim 15, wherein the chlorine-free precursors used to deposit the first work function metal layer or the second work function metal layer includes a tungsten compound with a nitrogen functional group, tungsten compound with a carbonyl functional group, or a tungsten compound in a cyclopentadienyl complex.

\* \* \* \* \*